United States Patent [19]

Kitsukawa et al.

[11] Patent Number: 4,999,519
[45] Date of Patent: Mar. 12, 1991

[54] SEMICONDUCTOR CIRCUIT WITH LOW POWER CONSUMPTION HAVING EMITTER-COUPLED LOGIC OR DIFFERENTIAL AMPLIFIER

[75] Inventors: Goro Kitsukawa, Nishitama; Kazumasa Yanagisawa; Takayuki Kawahara, both of Kokubunji; Ryoichi Hori, Nishitama; Yoshinobu Nakagome, Hachiouji; Noriyuki Hamma, Kodaira; Kiyoo Itoh, Higashi; Hiromi Tukada, Kokubunji, all of Japan

[73] Assignees: Hitachi VLSI Engineering Corporation; Hitachi Ltd., both of Tokyo, Japan

[21] Appl. No.: 277,992

[22] Filed: Nov. 30, 1988

[30] Foreign Application Priority Data

Dec. 4, 1987 [JP] Japan .................. 62-305639
Dec. 14, 1987 [JP] Japan .................. 62-315620
Jan. 20, 1988 [JP] Japan .................. 63-8373

[51] Int. Cl.$^5$ ........................................... H03K 19/86
[52] U.S. Cl. ................................. 307/446; 307/443; 307/455; 307/296.3; 365/227
[58] Field of Search ............... 307/443, 446, 455, 475, 307/491, 494, 495, 496, 530, 467, 296.3; 365/189.09, 208, 227, 229

[56] References Cited

U.S. PATENT DOCUMENTS

| 4,255,672 | 3/1981 | Ohno et al. | 307/467 |
| 4,543,499 | 9/1985 | Kaneko et al. | 307/446 X |
| 4,585,962 | 4/1986 | Sasayama | 307/446 X |
| 4,586,169 | 4/1986 | Itoh et al. | 307/455 X |
| 4,608,667 | 8/1986 | Barry | 365/189 |
| 4,682,058 | 7/1987 | Gal | 307/475 X |
| 4,709,169 | 11/1987 | Ashton et al. | 307/455 |
| 4,713,560 | 12/1987 | Herndon | 307/455 |
| 4,719,371 | 1/1988 | Fujita et al. | 307/455 |

FOREIGN PATENT DOCUMENTS 53-003219 2/1978 Japan .

Primary Examiner—David Hudspeth
Attorney, Agent, or Firm—Fay, Sharpe, Beall, Fagan, Minnich & McKee

[57] ABSTRACT

An ECL circuit wherein a current switch and an emitter follower are coupled, is so constructed that, in a standby mode, the current switch has its current cut off or rendered smaller than in an operating mode. In addition, the ECL circuit comprises means for decoupling a load resistance of the current switch and a base of the emitter follower in the case of cutting off the current of the current switch, or means for increasing the load resistance of the current switch in the case of rendering the current of the current switch smaller. The semiconductor circuit of the present invention can reduce the power consumption of the ECL circuit and can suppress fluctuations in the voltage levels of the outputs of the ECL circuit.

15 Claims, 15 Drawing Sheets

SEMICONDUCTOR CIRCUIT WITH LOW POWER CONSUMPTION HAVING EMITTER-COUPLED LOGIC OR DIFFERENTIAL AMPLIFIER

BACKGROUND OF THE INVENTION

The present invention relates to a semiconductor circuit. More particularly, it relates to a circuit arrangement which is well suited for operating an emitter-coupled logic (ECL) circuit or a differential amplifier circuit with low power consumption and at high speed.

Heretofore, a circuit arrangement as shown by way of example in FIG. 1 has been extensively employed for an emitter-coupled logic (ECL) circuit which has an emitter-follower output.

Referring to FIG. 1, symbols IN1 and IN2 denote input terminals, symbol $I_1$ the current of a constant-current source, symbol $V_{EE}$ a minus supply voltage, symbol $R_1$ a load resistance, symbol $R_T$ a terminating resistance, symbol $V_T$ a minus supply voltage for termination, symbol OUT an output terminal, and symbols $Q_1$, $Q_2$ and $Q_3$ N-P-N bipolar transistors.

In the circuit of FIG. 1, letting $V_{OH}$ indicate the output potential of the output terminal OUT in the case where the transistor $Q_1$ is conductive with the transistor $Q_2$ being nonconductive, and letting $V_{OL}$ indicate the output potential of the output terminal OUT in the reverse case where the transistor $Q_2$ is conductive with the transistor $Q_1$ being nonconductive, the values of the potentials $V_{OH}$ and $V_{OL}$ are respectively expressed by the following equations (1) and (2):

$$V_{OH} = -I_{BH}R_1 - V_{BE} \quad (1)$$

$$V_{OL} = -I_1 R_1 - I_{BL} R_1 - V_{BE} \quad (2)$$

Here, $I_{BH}$ denotes a current which flows through the base of the transistor $Q_3$ when the transistor $Q_2$ is nonconductive, $V_{BE}$ the base-emitter forward voltage of the transistor $Q_3$, and $I_{BL}$ a current which flows through the base of the transistor $Q_3$ when the transistor $Q_2$ is conductive.

The above equation (1) gives a value obtained by subtracting the product between $I_{BH}$ and $R_1$ (namely, the component of a voltage drop across the collector resistance $R_1$) and the component of a voltage drop across the base and emitter of the transistor $Q_3$ from an earth potential, and this value is the output potential delivered when the transistor $Q_2$ is nonconductive. On the other hand, the above equation (2) gives a value obtained in such a way that the product between the current $I_1$ passing through the transistor $Q_2$ and the resistance $R_1$, the product between the current flowing across the base and emitter of the transistor $Q_3$ via the resistance $R_1$ and this resistance $R_1$, and the component of the voltage drop across the base and emitter of the transistor $Q_3$ are subtracted from the earth potential, and this value is the output potential delivered when the transistor $Q_2$ is conductive.

Meanwhile, the high output potential $V_{OH}$ usually represents logic '1' and has a value of $-0.8$--$0.9$ V. The low output potential $V_{OL}$ usually represents logic '0' and has a value of $-1.6$--$1.7$ V. An output amplitude ($V_{OH}-V_{OL}$) is roughly equal to the product between $I_1$ and $R_1$, and is ordinarily required to be, at least, 0.8 V.

Next, FIG. 2 is a diagram in the case where a plurality of such prior-art ECL circuits are connected in parallel.

The wired-OR connection has been extensively employed as a circuit wherein, as shown in FIG. 2, the plurality of ECL circuits are coupled between chips or within an identical chip so as to execute logic processing. This connection is such that a plurality of emitter outputs are connected to one another and then terminated at the terminating voltage $V_T$ by the terminating resistance $R_T$.

By the way, in the circuit of FIG. 2, symbols $Q_1$–$Q_9$ denote N-P-N bipolar transistors, symbols $I_1$–$I_n$ the currents of constant-current sources, symbols IN11–IN1n and IN21–IN2n input terminals, and symbols $R_{11}$–$R_{1n}$ collector load resistances. The other symbols are the same as in FIG. 1.

Such a prior-art circuit has been so arranged that the outputs of a large number of nonselected circuits are brought to the low potential, and that the information '1' or '0' of one selected circuit is obtained at the output terminal OUT. It has accordingly been necessary that the corresponding ones of the currents $I_1$–$I_n$ are kept flowing also through the large number of nonselected circuits at all times, and that the corresponding ones of the inputs IN21–IN2n are held at a high potential. The reason is that, assuming the currents of the nonselected circuits to be zero, the emitter outputs of the nonselected circuits become the high potential irrespective of the potentials of the inputs IN21–IN2n, so the information '1' or '0' from the selected circuit is neglected. Accordingly, the currents $I_1$–$I_n$ of all the circuits need to be kept flowing.

In order to reduce the power consumption of the ECL circuit in FIG. 1, various methods have been considered. Now, when the value of the current $I_1$ of the constant-current source is made small with the intention of lowering the power, the value of the resistance $R_1$ needs to be set large for the purpose of attaining the prescribed output amplitude. By way of example, for the purpose of attaining an output amplitude equal to one in the case where the current $I_1$ is 4 mA and where the resistance $R_1$ is 250Ω, the resistance $R_1$ needs to be set at 500Ω when the current $I_1$ is halved to 2 mA, and the resistance $R_1$ needs to be set at 1 kΩ when the current $I_1$ is reduced to 1 mA.

Meanwhile, as apparent from the preceding equation (1), the high output potential $V_{OH}$ is affected by the product between the resistance $R_1$ and the base current $I_{BH}$ of the emitter-follower transistor $Q_3$. Letting $I_{OH}$ denote the output current of the emitter follower $Q_3$ generated when the output is the high potential $V_{OH}$, this output current $I_{OH}$ becomes about 24 mA for the output terminating conditions of $R_T = 50Ω$ and $V_T = -2$ V. Incidentally, the term $I_{BH} \times R_1$ in the preceding equation (1) can be replaced with the following equation:

$$I_{BH} \times R_1 = (I_{OH}/h_{FE}) \times R_1 \quad (3)$$

where $h_{FE}$ indicates the current gain of the bipolar transistor $Q_3$. On this occasion, in a case where the current gain $h_{FE}$ decreases due to enhancement in the withstand voltage of the bipolar transistor or where the resistance $R_1$ increases due to the lowering of the power as stated above, the output voltage $V_{OH}$ lowers to $-1$ V or less in accordance with the above equation (3) and the preceding equation (1), to incur the problem that the output level specification of the ECL circuit fails to be satisfied.

Next, as illustrated in FIG. 2, for the purpose of taking the wired-OR logic by means of the prior-art ECL circuits, the constant currents $I_1$–$I_n$ need to be normally kept flowing in both the selected mode and the nonselected mode. This incurs the problem that the power consumption increases.

Meanwhile, as a prior-art logic circuit of small amplitude and high speed, there has been a current switching circuit (also called "CML (current-mode logic) circuit") wherein the emitter currents of, for example, the ECL circuit as stated above are switched to change the collector voltages thereof. In this circuit, each bipolar transistor is operated in its unsaturated region in order to avoid the lowering of an operating speed which is the disadvantage of a saturation type switching circuit. Although the circuit exhibits the high operating speed, it has the problem that the power consumption is still high because the constant current is normally kept flowing therethrough. For the purpose of lowering the power consumption, therefore, a circuit system for changing-over consumptive currents between in an operating period and in a standby period has been proposed in, for example, the official gazette of Japanese Patent Application Publication No. 3219/1978.

As shown in FIG. 3, the prior-art technique of the logic circuit is such that, in the constant-current source of the ECL circuit configured of a bipolar transistor $Q_{303}$ and a resistance $R_{303}$, a pulsed control voltage $\emptyset_{OP}$ is impressed on the base of the transistor $Q_{303}$, thereby to turn "on" and "off" the current source. Since the current is thus caused to flow during only the operating period, the power consumption is somewhat lowered.

This circuit, however, has the problem that, when the current of the current source is cut off or decreased, the output becomes a high potential or the output amplitude changes.

FIG. 4 is a diagram showing the prior-art circuit disclosed in the aforementioned official gazette. In this circuit, a current control signal $\emptyset$ is used for controlling transistors $Q_{105}$, $Q_{106}$ and $Q_{107}$ which constitute the current sources of the transistors $Q_{101}$ and $Q_{102}$ of a current switching circuit and the transistors $Q_{103}$ and $Q_{104}$ of emitter-follower circuits Symbols $IN_{401}$ and $IN_{402}$ denote input terminals, and symbols $O_{401}$ and $O_{402}$ output terminals. When the potential of the current control signal $\emptyset$ is a high level, the three current sources formed of the bipolar transistors $Q_{105}$, $Q_{106}$ and $Q_{107}$ and resistances $R_{103}$, $R_{104}$ and $R_{105}$ cause predetermined currents to flow, whereas when the potential of the current control signal $\emptyset$ is a low level, the three current sources are turned "off." Thus, this circuit consumes the currents during only the operating period (namely, while the signal $\emptyset$ is at the high level) and can render the current consumption null during the standby period (namely, while the signal $\emptyset$ is at the low level), so that the power consumption can be reduced. Such a current control method is effective for lowering the power of a memory LSI or logic LSI. Here, the current control signal $\emptyset$ is a direct input signal which is applied from outside or a signal which is generated by an internal circuit with the external input signal.

In the prior art output stated above, quite no consideration is given to the output potentials and internal potentials during the standby period, namely, during the turn-off of the transistors $Q_{105}$, $Q_{106}$ and $Q_{107}$. On such an occasion, the saturation of bipolar transistors at the succeeding stages or the lowering of the operating speed of the circuit itself might be incurred for reasons to be elucidated below:

In general, the base-emitter voltage $V_{BE}$ of a bipolar transistor is expressed by the following equation:

$$V_{BE} = \frac{kT}{q} \ln\left(\frac{I_E}{I_S} + 1\right) \quad (3)$$

Here, $I_E$ denotes the emitter current of the bipolar transistor, $I_S$ the reverse saturation current thereof, k Boltzmann's constant, T an absolute temperature, and q the electron charge. The value of the voltage $V_{BE}$ is about 0.8 V in the state in which the current of ordinary magnitude flows. However, when the current $I_E$ becomes 1/10, the $V_{BE}$ value decreases in an amount of about 60 mV in accordance with the above equation. Accordingly, when the emitter currents of the transistor $Q_{103}$ and $Q_{104}$ become zero in the standby period, the potentials of the outputs $O_{401}$ and $O_{402}$ come closer to a supply voltage $V_{CC}$.

In actuality, the emitter currents do not become perfectly zero, but minute junction leakage currents flow through the transistors $Q_{103}$ and $Q_{104}$. Therefore, the potentials of the outputs $O_{401}$ and $O_{402}$ become values lower than the supply voltage $V_{CC}$, but they become approximately 0.5 V higher than the normal high potential ($V_{CC}$−0.8 V) in the operating period.

In addition, since the potentials depend upon the leakage currents, they disperse greatly.

When the potentials of the outputs $O_{401}$ and $O_{402}$ heighten in this manner, the bipolar transistors at the succeeding stages become liable to saturation, and moreover, the design of the circuit becomes difficult due to the great dispersions.

Besides, the potential of the common emitter point of the transistors $Q_{101}$ and $Q_{102}$ approaches the high potential of the input $IN_{401}$ or $IN_{402}$ for the same reason as in the foregoing when no current is caused to flow. This leads to the problem that the potential fluctuation of the common emitter point at the shift from the standby period to the operating period enlarges to delay the current switching operations of the transistor $Q_{101}$ and $Q_{102}$.

SUMMARY OF THE INVENTION

An object of the present invention is to ameliorate the problems as stated above, and to provide a semiconductor circuit which, while keeping a low power consumption, can suppress rises in the internal potentials and output potentials of the circuit and can prevent the degradation of the operating speed of the circuit itself, as well as the saturation of bipolar transistors in a succeeding circuit and the degradations of the response speeds thereof; to provide, in a circuit wherein the emitter-follower outputs of a plurality of ECL circuits are coupled by wired-OR, a semiconductor circuit which can render the consumptive currents of nonselected circuits null and which can deliver low potential outputs; to provide, in a circuit wherein an ECL circuit and an emitter follower are connected, a semiconductor circuit the high output potential of which does not lower even when the ECL circuit is operated with a low current; and to provide a semiconductor circuit the output amplitude of which can be held constant even when the operating current of an ECL circuit, or more extensively, a differential amplifier circuit has changed.

The above object can be accomplished by:

(i) the expedient that a first circuit wherein a current switching circuit and an emitter follower or source follower are combined, is furnished with a second circuit which changes-over currents in a standby mode and an operating mode, and is further furnished with a third circuit which renders the voltage level of the first circuit substantially definite irrespective of the values of the currents;

(ii) the expedient that a semiconductor circuit wherein a plurality of circuits each including a current switch and an emitter follower are emitter-coupled in parallel so as to construct a logic circuit, comprises first switching means for turning "on" and "off" the switching current of the current switch, and second switching means inserted between the load resistance of the current switch and the base of the emitter follower, the output potential of the emitter follower being lowered by turning "off" both the first and second switching means in each of the current switches of nonselected mode among the plurality of current switches; or (iii) the expedient that the value of the load resistance of a current switching circuit is changed-over in interlocking with the change of the current source of the current switching circuit.

In the expedient (i), when the first circuit operates, a great current is caused to flow by the second circuit, and the voltage level of the first circuit is set by the third circuit. The third circuit can hold the set voltage level substantially constant irrespective of the magnitudes of the currents, so that a small current can be caused to flow by the second circuit when the first circuit stands by. Conjointly with the above measure, the amplitude of the operating signal of the first circuit is narrowed, whereby a low power consumption can be attained, and a semiconductor circuit of small amplitude, low power consumption and high speed can be realized.

In the expedient (ii), a MOS transistor is connected to the node between the current switching circuit and the emitter-follower circuit, that is, to the base of an emitter-follower transistor, and also a MOS transistor for turning current "on" and "off" is inserted near a point through which the current of the current switch of an ECL circuit flows, that is, near a constant-current source. In each of the nonselected ones of the parallel ECL circuits which have an arrangement endowed with the on-off functions, the current of the current switch is rendered zero, and the MOS transistor connected to the base input of the emitter follower is turned "off" to render the emitter-follower transistor nonconductive, whereby a value equal to a terminating voltage is obtained as a low potential output at the emitter output of the emitter follower through a terminating resistance. On the other hand, when the ECL circuit operates or is selected, the prescribed current of the current switch is caused to flow, and the MOS transistor of the base input portion is turned "on," whereby the potential of '1' or '0' corresponding to the input signals of the ECL circuit can be generated.

Further, a MOS transistor is inserted in parallel with the load resistance of the current switch of the ECL circuit, and the "on" resistance of this MOS transistor is changed according to the input signal thereof. Thus, in case of affording a high potential at the output of the emitter follower, the "on" resistance of the MOS transistor is lowered, thereby to decrease the value of a parallel resistance which is configured of the load resistance and the MOS transistor. As a result, an effective load resistance lowers, so that the high output potential $V_{OH}$ can be raised in conformity with Eq. (1) mentioned before. On the other hand, in case of affording a low potential at the output, the "on" resistance of the MOS transistor is raised or this MOS transistor is turned "off," thereby to equalize the effective load resistance to the resistance $R_1$. As a result, the low output potential $V_{OL}$ can be generated in the same manner as in the prior-art circuit.

The expedient (iii) is somewhat similar in construction to the expedient (ii). The load resistances of the current switching circuit are disposed in a number of at least two, switching means is disposed in series with these loads, and this switch is interlocked with the variable-current source. When the circuit operates, switching is performed so as to increase the current of the current source and to lower the load resistance, whereby a high-speed operation is achieved. On the other hand, when the circuit stands by, the switching is performed so as to decrease the current of the current source and to raise the load resistance, whereby a low power consumption is attained. Since, on this occasion, the output amplitude of the circuit is determined by the product between the current and the load resistance, it is also possible to hold the output amplitudes of the operating mode and the standby mode substantially constant.

DESCRIPTION OF THE PREFERRED EMBODIMENTS

Now, embodiments of the present invention will be described in detail with reference to the drawings.

Figure 5:
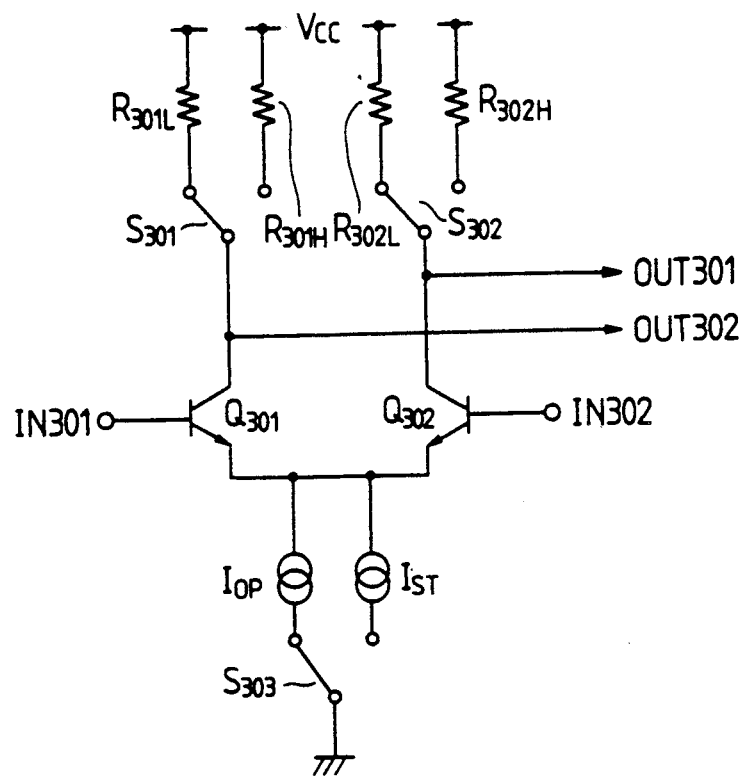
FIG. 5, FIG. 23 and FIG. 26 are schematic circuit arrangement diagrams for explaining the operating principles of semiconductor circuits according to the present invention, respectively.

EMBODIMENT 1:

FIG. 5 is a diagram showing the fundamental embodiment of the present invention. Two current sources $I_{OP}$ and $I_{ST}$ are comprised, and either of them is operated through a switch $S_{303}$. Current switches have load resistances $R_{301L}$ and $R_{301H}$, and $R_{302L}$ and $R_{302H}$ on affirmation and negation sides, respectively, and these resistances are respectively changed-over by switches $S_{301}$ and $S_{302}$. The currents of the current sources and the load resistances of the current switches are set at $I_{OP} > I_{ST}$, $R_{301L} < R_{301H}$, and $R_{302L} < R_{302H}$. In the operating mode of the circuit, the switches $S_{301}$–$S_{303}$ are connected as illustrated in FIG. 5, whereby the current $I_{OP}$ flows, and the load resistances $R_{301L}$ and $R_{302L}$ are selected. On this occasion, the current $I_{OP}$ flows through either of switching transistors $Q_{301}$ and $Q_{302}$ in accordance with the input signals of input terminals $IN_{301}$ and $IN_{302}$. Thus, the high potential side of output terminals $OUT_{301}$ and $OUT_{302}$ becomes a potential $V_{CC}$, while the low potential side becomes a potential ($V_{CC} - I_{OP} \times R_{301L}$) or ($V_{CC} - I_{OP} \times R_{302L}$). On the other hand, when the circuit stands by, the switches $S_{301}$–$S_{303}$ are connected to the sides opposite to those depicted in FIG. 5, whereby the current $I_{ST}$ flows, and the load resistances $R_{301H}$ and $R_{302H}$ function. In accordance with the input signals, the high potential side of the output terminals $OUT_{301}$ and $OUT_{302}$ becomes the potential $V_{CC}$, and the low potential side becomes a potential $V_{CC} - I_{ST} \times R_{301H}$ or ($V_{CC} - I_{ST} \times R_{302H}$). By setting the currents and the loads at $I_{OP} \times R_{301L} \approx I_{ST} \times R_{301H}$, $R_{301L} \approx R_{302L}$, and $R_{301H} \approx R_{302H}$, the output amplitudes of the circuit can be held substantially constant in the operating mode and the standby mode. In general, in the standby mode, the input signals do not change, so that the output signals may merely hold voltages required for operating a circuit at the succeeding stage, and the operating speed of the illustrated circuit does not pose a problem, so that the current $I_{ST}$ may be small. Incidentally, each of the switches $S_{301}$–$S_{303}$ need not be completely changed-over to either side. By way of example, as in an embodiment to be described later, it is also allowed that the current $I_{ST}$ is normally kept flowing in both the operating mode and the standby mode, and that the resistances $R_{301H}$ and $R_{302H}$ are normally connected to the collectors of the respective transistors $Q_{301}$ and $Q_{302}$. In this case, in the operating mode, a current ($I_{OP} + I_{ST}$) is caused to flow, and the load resistance becomes a parallel resistance consisting of the resistances $R_{301L}$ and $R_{301H}$, or $R_{302L}$ and $R_{302H}$ (the parallel resistance is, in effect, substantially equal to the low resistance $R_{301L}$ or $R_{302L}$). Further, the present invention is extensively applicable to a case where, unlike the bipolar transistors, MOS transistors are employed as the transistors $Q_{301}$ and $Q_{302}$, a case where MOS transistors are employed for the load resistances and the current sources, and so forth. Besides, the output amplitudes of the operating mode and the standby mode need not always be perfectly equalized, and output amplitudes necessary for the succeeding circuit may be generated.

Figure 6:
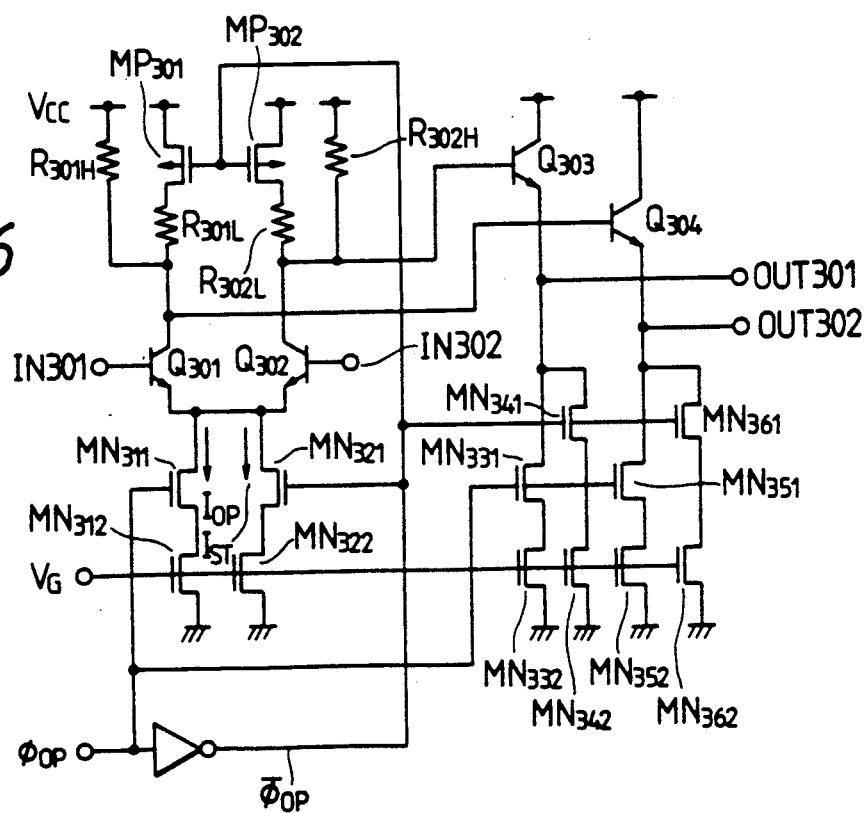
FIG. 6, FIGS. 8–12, FIG. 14, FIG. 16, FIG. 18, FIG. 21, FIG. 24, FIG. 25 and FIGS. 27–29 are circuit arrangement diagrams each showing a semiconductor circuit in an embodiment of the present invention.

EMBODIMENT 2:

FIG. 6 shows a more practicable form of the embodiment in FIG. 5. The switches $S_{301}$ and $S_{302}$ in the embodiment of FIG. 5 are respectively constructed of MOS transistors $MP_{301}$ and $MP_{302}$ (PMOS transistors), and the switch $S_{303}$ is constructed of MOS transistors $MN_{311}$ and $MN_{321}$ (NMOS transistors). In addition, the outputs $OUT_{301}$ and $OUT_{302}$ are respectively derived through emitter-follower transistors $Q_{303}$ and $Q_{304}$ in order to enhance the load driving abilities thereof. The currents of the emitter follower are also controlled using MOS switches $MN_{331}$ and $MN_{341}$, and $MN_{351}$ and $MN_{361}$. In this figure, symbol $V_G$ denotes a current controlling reference voltage, and symbols $MN_{312}$, $MN_{322}$, $MN_{332}$, $MN_{342}$, $MN_{352}$ and $MN_{362}$ denote current control transistors. The currents in the operating mode and the standby mode are determined by changing the gate width/gate length ratios of these six MOS transistors. In such a circuit arrangement, the reference voltage $V_G$ is set at a regulated voltage which does not depend upon a supply voltage and a chip temperature, and MOS transistors of comparatively great gate lengths and gate widths which are less susceptible to process fluctuations are employed as the current control transistors $MN_{312}$, $MN_{322}$, $MN_{332}$, $MN_{342}$, $MN_{352}$ and $MN_{362}$, thereby to bring forth the advantage that the current constancy is enhanced. Besides, transistors of small gate widths which serve merely for switching are employed as the MOS switches $MN_{311}$, $MN_{321}$, $MN_{331}$, $MN_{341}$, $MN_{351}$ and $MN_{361}$, thereby to bring forth the advantage that the load capacitances of pulses $\emptyset_{OP}$ and $\overline{\emptyset}_{OP}$ are reduced, so $\emptyset_{OP}$ and $\overline{\emptyset}_{OP}$ pulse generators can have their operating speeds raised or their power consumptions lowered. Regarding the load resistances, the high resistances $R_{301H}$ and $R_{302H}$ are normally connected to the collectors of the respective transistor $Q_{301}$ and $Q_{302}$, and the low resistances $R_{301L}$ and $R_{302L}$ are employed as the effective load resistances in the operating mode by the use of the PMOS switches $MP_{301}$ and $MP_{302}$. Owing to the circuit arrangement thus far described, in the operating mode, the pulse $\emptyset_{OP}$ is set at a high potential, and the pulse $\overline{\emptyset}_{OP}$ is set at a low potential, whereby the switching transistor $MN_{311}$ is turned "on" to cause a great switching current to flow, the switching transistors $MN_{331}$ and $MN_{351}$ are turned "on" to cause great emitter-follower currents to flow, and the switches $MP_{301}$ and $MP_{302}$ are turned "on" to establish the low load resistances, so that the outputs $OUT_{301}$ and $OUT_{302}$ quickly respond to the changes of the inputs $IN_{301}$ and $IN_{302}$. On the other hand, in the standby mode, the pulse $\emptyset_{OP}$ is set at the low potential, and the pulse $\overline{\emptyset}_{OP}$ at the high potential, whereby the switching transistor $MN_{321}$ is turned "on" to cause a small switching current to flow, the switching transistors $MN_{341}$ and $MN_{361}$ are turned "on" to cause small emitter-follower currents to flow, and the switches $MP_{301}$ and $MP_{302}$ are turned "off" to establish the high load resistances $R_{301H}$ and $R_{302H}$, so that a comparatively wide output amplitude can be produced across the terminals $OUT_{301}$ and $OUT_{302}$ in spite of the small switching current and emitter-follower currents. Especially when $I_{OP} \times R_{301L} = I_{ST} \times R_{301H}$ is set, the output amplitudes in the operating mode and the standby mode can be equalized.

Figure 7:
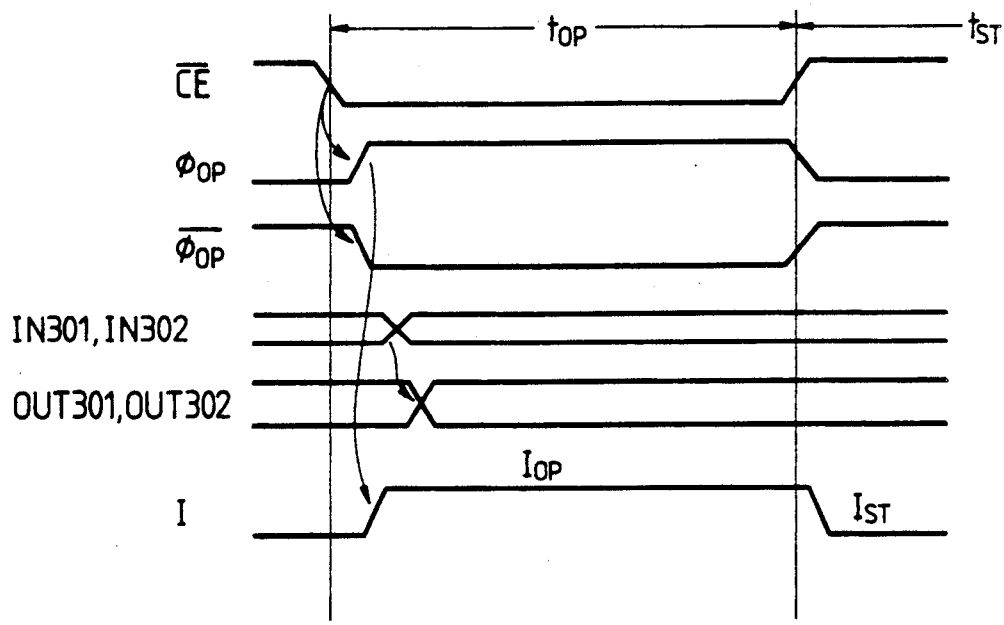
FIG. 7 is a graph showing the changes of voltages and currents in order to elucidate the operation of the semiconductor circuit illustrated in FIGS. 5 and 6.

FIG. 7 shows the outlines of voltage and current waveforms in the embodiment illustrated in FIG. 5 or FIG. 6. Symbol $t_{OP}$ indicates the operating period of time, and symbol $t_{ST}$ the standby period of time. Symbol $\overline{CE}$ denotes a chip enable input signal which defines these two states, and from which the signals $\phi_{OP}$ and $\overline{\phi_{OP}}$ are formed within a chip. Letter I indicates the sum of the switching currents flowing through the transistors $Q_{301}$ and $Q_{302}$, and it signifies that the current $I_{OP}$ flows during the operating period of time, while the current $I_{ST}$ flows during the standby period of time. Owing to the effects of the present invention, the potentials of the output terminals $OUT_{301}$ and $OUT_{302}$ can be held constant in both the operating and standby periods of time.

Figure 8:
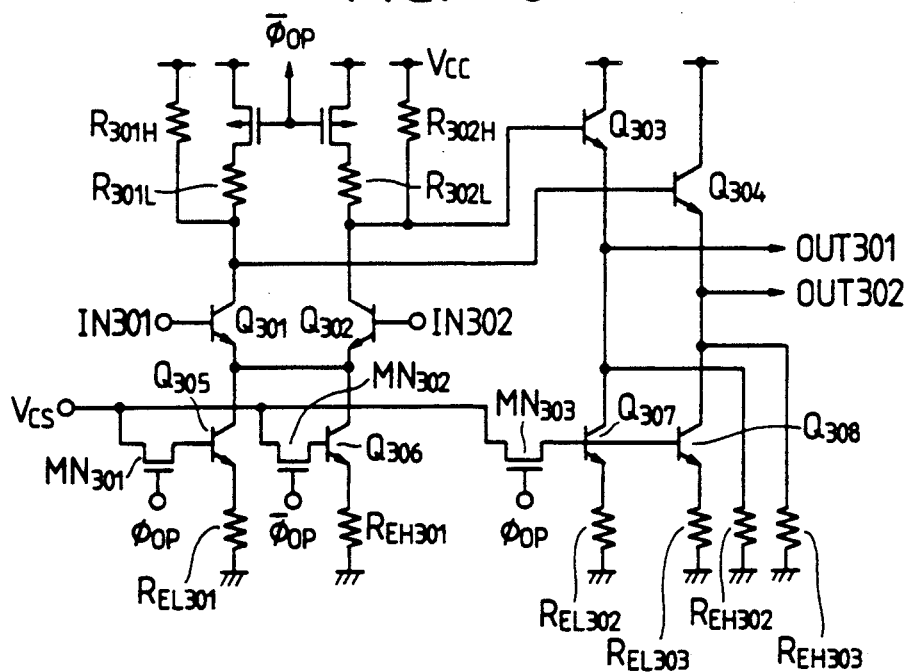

EMBODIMENT 3:

FIG. 8 shows an embodiment in which substantially the same functions as in the embodiment illustrated in FIG. 6 are realized by current sources configured of bipolar transistors and resistances, not by the current sources configured of the MOS transistors. Whether or not a reference voltage $V_{CS}$ is applied to the bases of the bipolar transistors $Q_{305}$, $Q_{306}$, $Q_{307}$ and $Q_{308}$ constituting the constant-current sources, is controlled by switches which are constructed of NMOS transistors $MN_{301}$, $MN_{302}$ and $MN_{303}$. Symbols $R_{EL301}$, $R_{EL302}$ and $R_{EL303}$ denote the low resistances which determine currents in the operating mode, while symbols $R_{EH301}$, $R_{EH302}$ and $R_{EH303}$ denote the high resistances which determine currents in the standby mode. In the operating mode, the signal $\phi_{OP}$ is set at the high potential and the signal $\overline{\phi_{OP}}$ at the low potential, to turn "on" the switches $MN_{301}$ and $MN_{303}$ and the switch $MN_{302}$ "off," whereby great currents determined by the resistances $R_{EL301}$–$R_{EL303}$ are caused to flow through the current switches and the emitter follower. On the contrary, in the standby mode, the switch $MN_{302}$ is turned "on" and the switches $MN_{301}$ and $MN_{303}$ are turned "off," whereby small currents determined by the resistances $R_{EH301}$–$R_{EH303}$ are caused to flow. The configuration of the variable load resistances is the same as in the preceding embodiment, and during the standby period, an output amplitude equal to that of the operating period can be derived even with the small currents.

Figure 9:
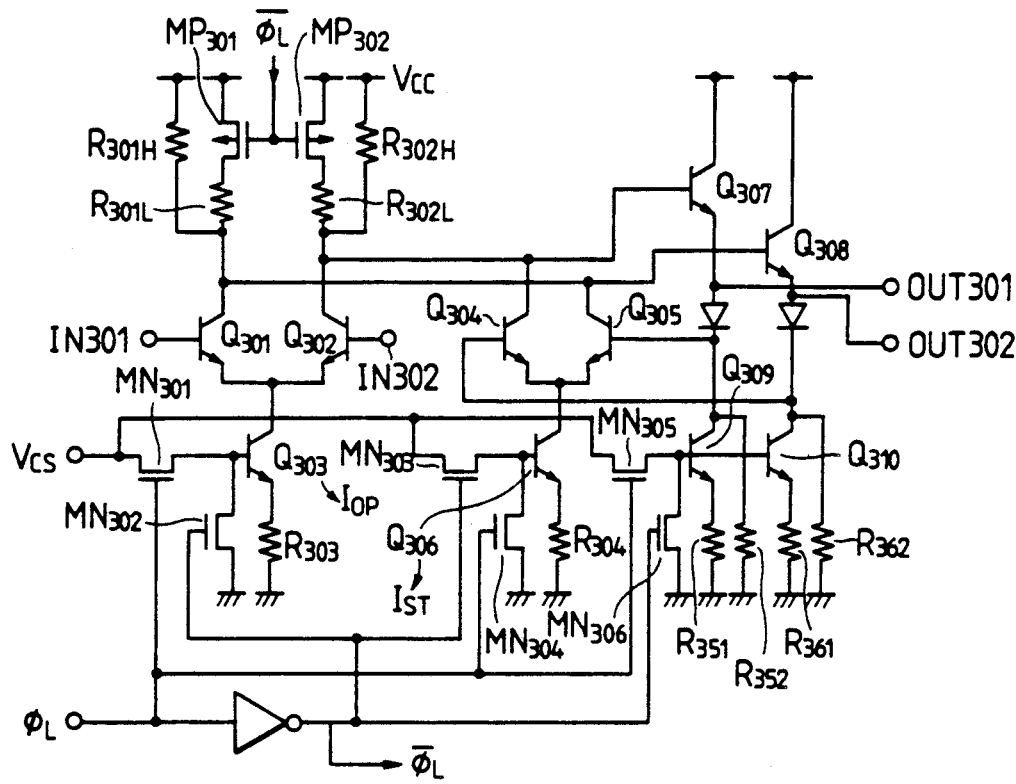

EMBODIMENT 4:

FIG. 9 shows an embodiment in which the present invention is applied to a latch circuit. A switching current source and an emitter-follower current source are configured of bipolar transistors $Q_{303}$ and $Q_{306}$ and resistances $R_{303}$ and $R_{304}$. Whether or not a control voltage $V_{CS}$ is applied to the bases of the transistors $Q_{303}$ and $Q_{306}$, is controlled by NMOS transistors. Here, resistances are set at $R_{303} << R_{304}$, $R_{351}$, $R_{361} << R_{352}$, $R_{362}$. In the latch circuit, when a signal $\phi_L$ is at a high potential, inputs $IN_{301}$ and $IN_{302}$ are accepted, and when the signal $\phi_L$ is at a low potential (a signal $\overline{\phi_L}$ is at the high potential), outputs at terminals $OUT_{301}$ and $OUT_{302}$ are respectively fed back to bipolar transistors $Q_{304}$ and $Q_{305}$ so as to hold these outputs. In this circuit, when the signal $\phi_L$ is at the high potential, the base potential of the transistor $Q_{303}$ becomes equal to the control voltage $V_{CS}$, and a current $I_{OP}$ determined by the resistance $R_{303}$ flows. On this occasion, MOS transistors $MP_{301}$ and $MP_{302}$ are also turned "on," and effective load resistances become resistances $R_{301L}$ and $R_{302L}$. At this time, as emitter-follower currents, currents determined by the low resistances $R_{351}$ and $R_{361}$ flow because the voltage $V_{CS}$ is applied to the bases of transistors $Q_{309}$ and $Q_{310}$. In this manner, when the signal $\phi_L$ is at the high potential, both the switching current and the emitter-follower currents are great, and the load resistances are low, so that the input data items of the terminals $IN_{301}$ and $IN_{302}$ can be rapidly accepted to bring forth changes in the outputs $OUT_{301}$ and $OUT_{302}$. On the contrary, when the signal $\phi_L$ is at the low potential with the signal $\overline{\phi_L}$ being at the high level, the transistor $Q_{303}$ is turned "off" and the transistor $Q_{306}$ "on," so that feedback loops are formed of the terminals $OUT_{301}$ and $OUT_{302}$ and the transistors $Q_{304}$ and $Q_{305}$, and the outputs are held with the inputs $IN_{301}$ and $IN_{302}$ neglected. Owing to this arrangement, the circuit operates at high speed with the great currents and low load resistances during the operating period of time for accepting the input data, and it operates with the small currents and can generate a fixed output amplitude during the period of time for retaining the data.

Figure 10:
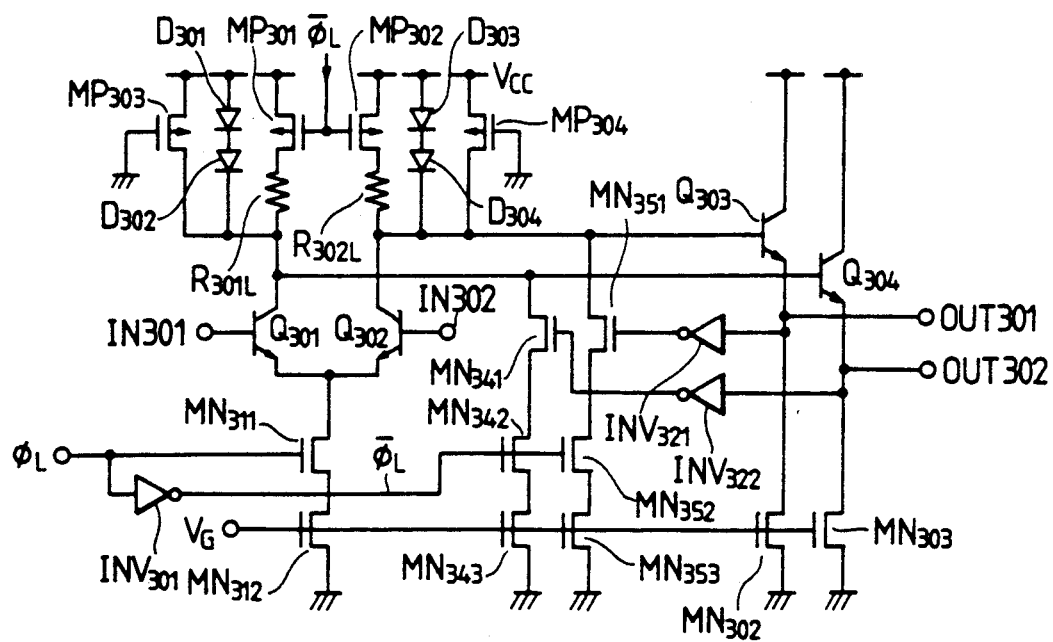

EMBODIMENT 5:

Also FIG. 10 shows an embodiment concerning a latch circuit, but this embodiment differs from the embodiment of FIG. 9 in that a feedback circuit is realized using MOS transistors, not by the bipolar transistors. More specifically, the feedback circuit is such that outputs $OUT_{301}$ and $OUT_{302}$ are respectively received by CMOS inverters $INV_{321}$ and $INV_{322}$, the outputs of which are respectively applied to the gates of NMOS transistors $MN_{351}$ and $MN_{341}$. The functions of the signals $\phi_L$ and $\overline{\phi_L}$ are the same as in FIG. 9, and when the signal $\phi_L$ is at the high potential, the input data items $IN_{301}$ and $IN_{302}$ are accepted, while when the signal $\phi_L$ is at the low potential, the corresponding output voltages are held. Under the holding state, current flows through neither of bipolar transistors $Q_{301}$ and $Q_{302}$, but a small holding current flows through either a series path consisting of MOS transistors $MN_{341}$, $MN_{342}$ and $MN_{343}$ or a series path consisting of MOS transistors $MN_{351}$, $MN_{352}$ and $MN_{353}$. A load resistance on this occasion is a PMOS transistor $MP_{303}$ or $MP_{304}$. Shown at symbols $D_{301}$–$D_{304}$ are diodes for clamping voltages, which prevent the saturation of the bipolar transistors $Q_{301}$ and $Q_{302}$ attributed to the lowering of the collector potentials thereof and fix the output amplitudes of the transistors to about 2 $V_{BE}$ (where $V_{BE}$ denotes the base-emitter forward voltage of each transistor) even when the holding currents or the load resistances disperse. Also in this circuit, principally MOS transistors $MN_{312}$, $MN_{343}$ and $MN_{353}$ have their gate widths and gate lengths adjusted for the purposes of causing a great current to flow through MOS transistors $MN_{311}$ and $MN_{312}$ when the input data items are accepted and causing the slight holding current to flow through the MOS transistors $MN_{341}$–$MN_{343}$ or $MN_{351}$–$MN_{353}$ when the outputs are held. Although, in the illustration, emitter-follower currents are not changed, they can be changed using the signals $\phi_L$ and $\overline{\phi_L}$ or other suitable signals as in the preceding embodiment. As thus far described, the embodiment in FIG. 10 employs the MOS transistors for the feedback loops which do not require a very high speed. Advantageously, therefore, it can be implemented with an area smaller than that of the embodiment in FIG. 9.

Figure 11:
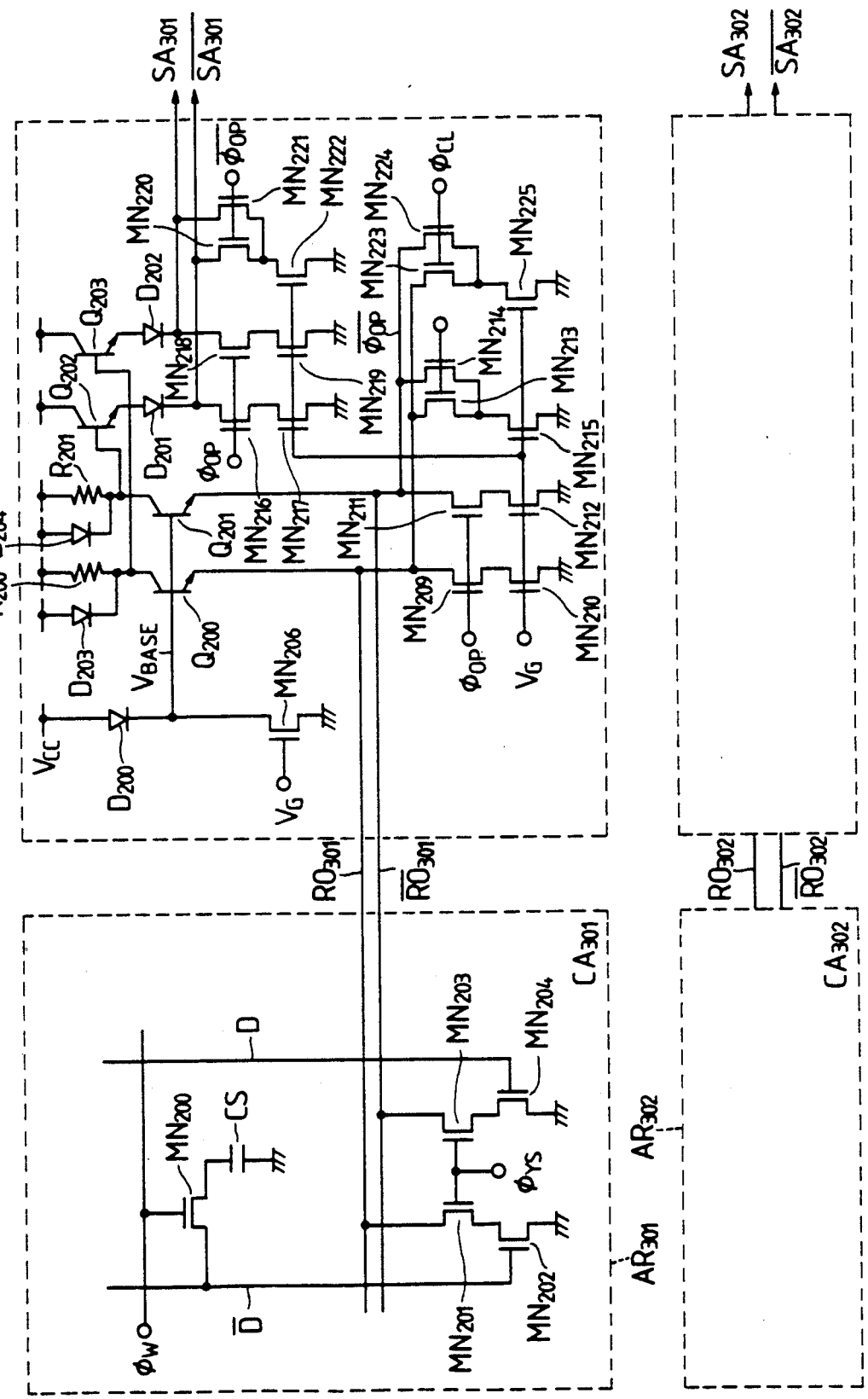
Figure 12:
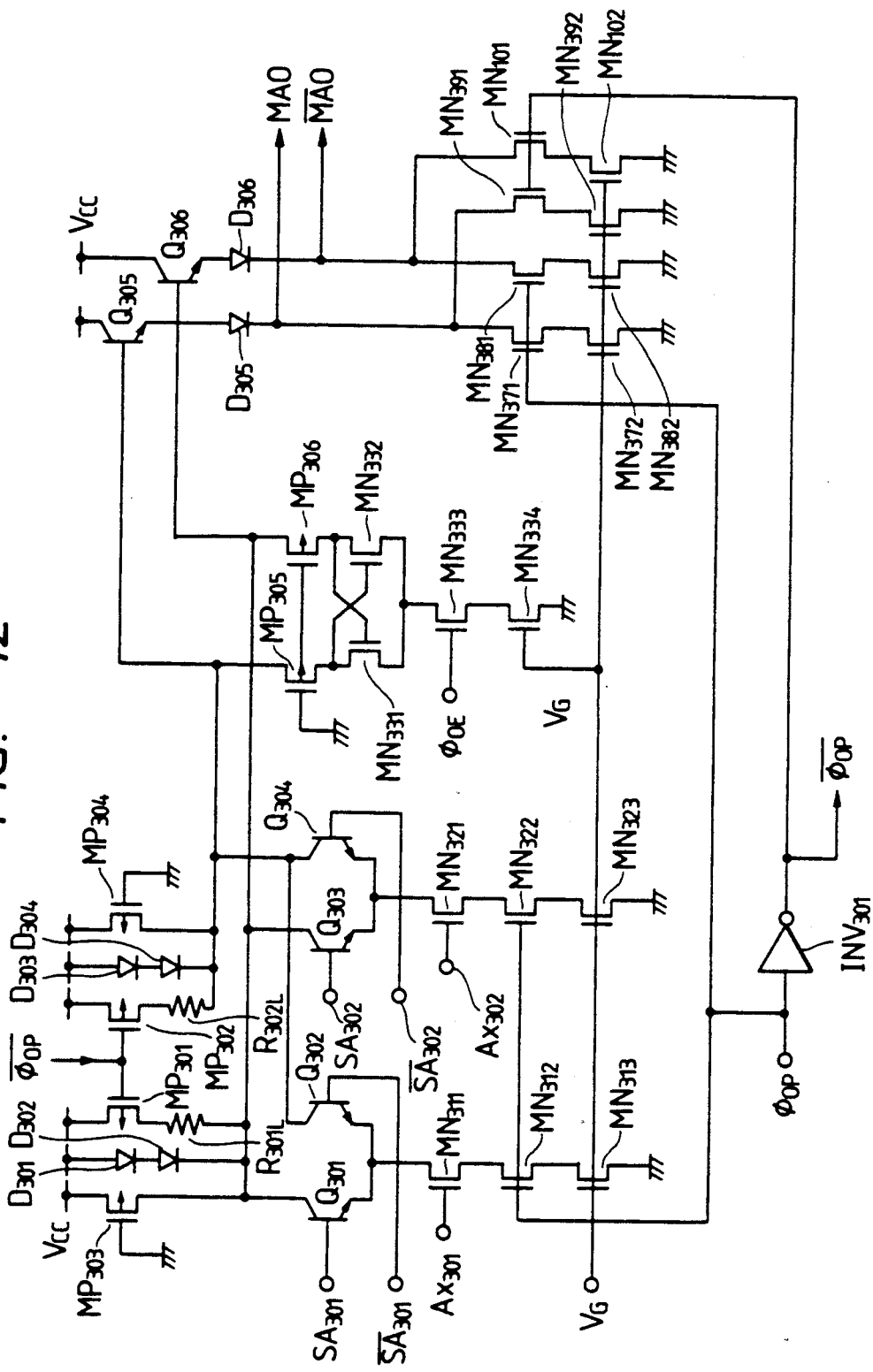
Figure 13:
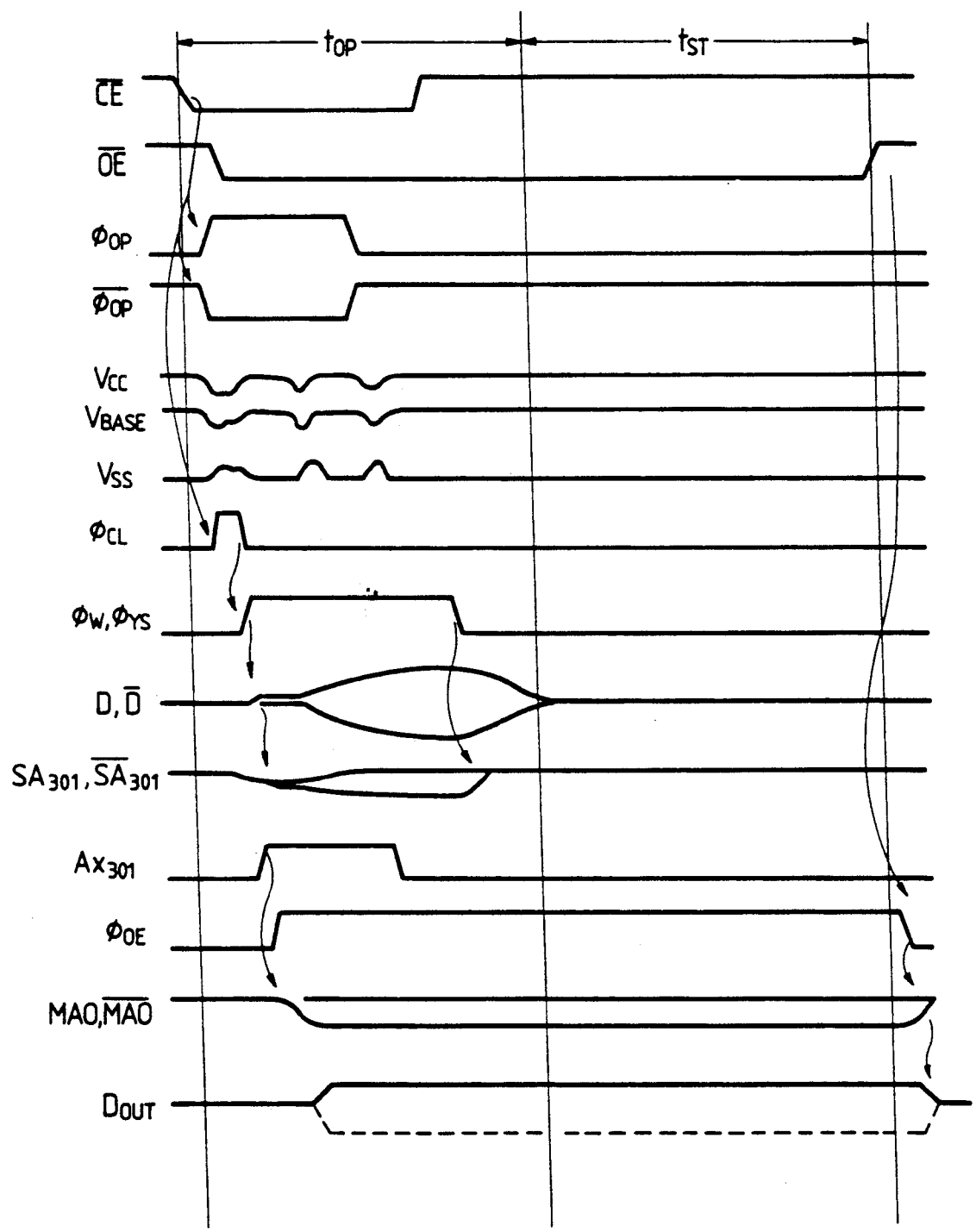
FIG. 13 is a graph showing the changes of voltages and currents in order to elucidate the operations of the semiconductor circuits illustrated in FIGS. 11 and 12.

EMBODIMENT 6:

FIGS. 11 and 12 show an embodiment in which the present invention is applied to the readout circuit and main amplifier of a bipolar-CMOS composite type dynamic RAM (BiCMOS DRAM). Of them, FIG. 11 shows the memory cell arrays and readout circuit of the DRAM, while FIG. 12 shows the main amplifier circuit which has the functions of selecting and latching readout signals. In the memory cell array $AR_{301}$ in FIG. 11, a data line-precharging circuit and a rewriting circuit required for the operation of the DRAM are omitted from the illustration. In addition, FIG. 13 is an operating timing chart of the circuits shown in FIGS. 11 and 12. Symbol $\overline{CE}$ in FIG. 13 indicates a chip enable input signal, which is at a low potential for the operating period of time and which becomes a high potential for the standby period of time. When the signal $\overline{CE}$ is switched from the high potential to the low potential, the peripheral circuits of the DRAM start operating. Symbol $\overline{OE}$ indicates an output enable input signal, and while this input signal is at a low potential, a memory output $D_{OUT}$ shall be held even when the signal $\overline{CE}$ designates the standby period of time. When the signal $\overline{CE}$ becomes the low potential, a word line $\phi_W$ and a column select line $\phi_{YS}$ as specified are brought to a high potential by an address input, so that a potential difference appears between data lines D and $\overline{D}$, and a current difference arises between common readout lines $RO_{301}$ and $R_{301}$. Thus, a voltage difference develops between the collectors of grounded-base bipolar transistors $Q_{200}$ and $Q_{201}$, and readout signals are derived at sense amplifier outputs $SA_{301}$ and $\overline{SA}_{301}$ via emitter followers. Readout signals are also derived at sense amplifier outputs $SA_{302}$ and $SA_{302}$ from the other memory cell array $AR_{302}$. Also in this circuit, a current control is performed so that great currents may flow for the operating period of time and that small currents may flow for the standby period of time, by employing signals $\phi_{OP}$ and $\phi_{OP}$ and adjusting the gate lengths and gate widths of MOS transistors $MN_{210}$, $MN_{212}$, $MN_{215}$, $MN_{217}$, $MN_{219}$, $MN_{219}$, $MN_{222}$ and $MN_{225}$. Meanwhile, in the DRAM, when the signal $\overline{CE}$ becomes the low potential, large numbers of address buffers and decoder circuits start operating at the same time. An experiment conducted on a DRAM of 1 Mbit has revealed that, for the above reason, the potentials of $V_{CC}$ and $V_{SS}$ (GND) lines near the readout circuit in FIG. 11 undergo fluctuations of about 0.5 V as illustrated in FIG. 13. In consequence, the base potentials $V_{BASE}$ of the transistors $Q_{200}$ and $Q_{201}$ lower about 0.5 V in accordance with the $V_{CC}$ noise, whereas the emitter potentials thereof are difficult to lower because of the large parasitic capacitances of the common readout lines $RO_{301}$ and $\overline{RO}_{301}$, so that the cutoff periods of these transistors $Q_{200}$ and $Q_{201}$ lengthen. When, under the cutoff states of the transistors, the word line signal $\phi_W$ and the column select signal $\phi_{YS}$ rise into the selecting states of high potential, a current difference develops between the lines $RO_{301}$ and $\overline{RO}_{301}$ in accordance with the signals D and $\overline{D}$. However, signal voltages do not appear on the collector sides of the transistors $Q_{200}$ and $Q_{201}$ until the potentials $RO_{301}$ and $\overline{RO}_{301}$ lower to turn "on" these transistors again. In this manner, the inherent high-speed property of the current sensing system fails to be demonstrated due to the power source noise within a chip. It is very difficult to reduce the power source noise. Especially in the DRAM (or an SRAM), power source noise of large magnitudes arises for such reasons that a large number of circuits are simultaneously started by an external clock input, that signal amplitudes are as great as a supply voltage, and that a rewriting operation is performed in the DRAM. In the present invention, therefore, the emitter bias currents of the transistors $Q_{200}$ and $Q_{201}$ are particularly increased for a period until the signals $\phi_W$ and $\phi_{YS}$ are brought to the selecting level after the chip has fallen into its operating state. Thus, the "on" recovery of the transistors $Q_{200}$ and $Q_{201}$ is quickened in order that the signal voltages may appear on the collector sides of the transistors $Q_{200}$ and $Q_{201}$ as soon as the signals $\phi_W$ and $\phi_{YS}$ are brought to the selecting level. More specifically, in the circuit of FIG. 11, besides the measure of increasing and decreasing the emitter bias currents with the signals $\phi_{OP}$ and $\phi_{OP}$ in the ordinary operating and standby periods of time, the bias currents are especially increased by three MNOS transistors $MN_{223}$, $MN_{224}$ and $MN_{225}$ and a control signal $\phi_{CL}$ for the period until the signals $\phi_W$ and $\phi_{YS}$ are set at the selecting level after the chip has fallen into the operating state. The timing of the signal $\phi_{CL}$ is shown in FIG. 13. By way of example, there are considered a set value of about 5 $\mu$A for the transistor $MN_{215}$, set values of about 50 $\|$ A for the transistors $MN_{210}$ and $MN_{212}$, and a set value of about 0.5 mA for the transistor $MN_{225}$. In the arrangement of FIG. 11, minute currents are caused to flow through the common readout lines $RO_{301}$, $\overline{RO}_{301}$ and the sense output lines $SA_{301}$, $\overline{SA}_{301}$ even during the standby period of time so as to suppress the potential fluctuations of these lines. When the chip is started, great currents are caused to flow particularly through the lines $RO_{301}$ and $\overline{RO}_{301}$ by the $\phi_{CL}$ control as stated before. The switching MOS transistors $MN_{213}$ and $MN_{214}$, $MN_{223}$ and $MN_{224}$, and $MN_{220}$ and $MN_{221}$ of the current sources of the common readout lines and sense output lines have their sources connected to each other, and the respective connection points are connected to the drains of the current limiting MOS transistors $MN_{215}$, $MN_{225}$ and $MN_{222}$. When the sources of the two switching MOS transistors are connected in this manner, the pair of common readout lines or the pair of sense output lines can be rendered equipotential during the standby period. Therefore, this measure is also effective for shortening the access time of the DRAM.

The two sets of sense outputs $SA_{301}$, $\overline{SA}_{301}$ and $SA_{302}$, $\overline{SA}_{302}$ obtained here are further amplified by the main amplifier having the selecting function and latching function as shown in FIG. 12, whereby main amplifier outputs MAO, $\overline{MAO}$ are produced. The amplified outputs MAO and $\overline{MAO}$ are sent to an output circuit so as to produce the memory output $D_{OUT}$. The terminals MAO and $\overline{MAO}$ have the function of holding the outputs even during the standby period ($\overline{CE}$: high potential) in accordance with a signal $\phi_{OE}$ which is controlled by an external input $\overline{OE}$. Symbols $AX_{301}$ and $AX_{302}$ denote decode signals which are generated using parts of address signals, and which serve to select either of the two sets of sense outputs ($SA_{301}$, $\overline{SA}_{301}$) and ($SA_{302}$, $\overline{SA}_{302}$). For example, when the signal $AX_{301}$ is at a high potential, the sense outputs $SA_{301}$ and $\overline{SA}_{301}$ are validated. Besides, unlike that of the embodiment shown in FIG. 10, a latch circuit applies the base potentials of transistors $Q_{305}$ and $Q_{306}$ to the gates of cross-connected transistors $MN_{331}$ and $MN_{332}$ through transistors $MP_{305}$ and $MP_{306}$. When the signal $\phi_{OE}$ is at a high potential, a transistor $MN_{333}$ turns "on," and a low current determined by a transistor MN$_{334}$ and a voltage V$_G$ flows from either of the transistors MN$_{331}$ and MN$_{332}$. The transistors MP$_{305}$ and MP$_{306}$ are equivalent to level shifting resistances.

When the external input $\overline{OE}$ is at a low potential in the standby period ($\overline{CE}$: high potential), the signal $\emptyset_{OE}$ is at the high potential, and the signal $\emptyset_{OP}$ is at the low potential. Therefore, the outputs MAO and $\overline{MAO}$ can be held with only a low current which is determined by the MOS transistor MN$_{334}$ in FIG. 12. In this way, it is possible to obtain a wide operating margin which does not depend upon the supply voltage V$_{CC}$, temperatures and process fluctuations.

Figure 14:
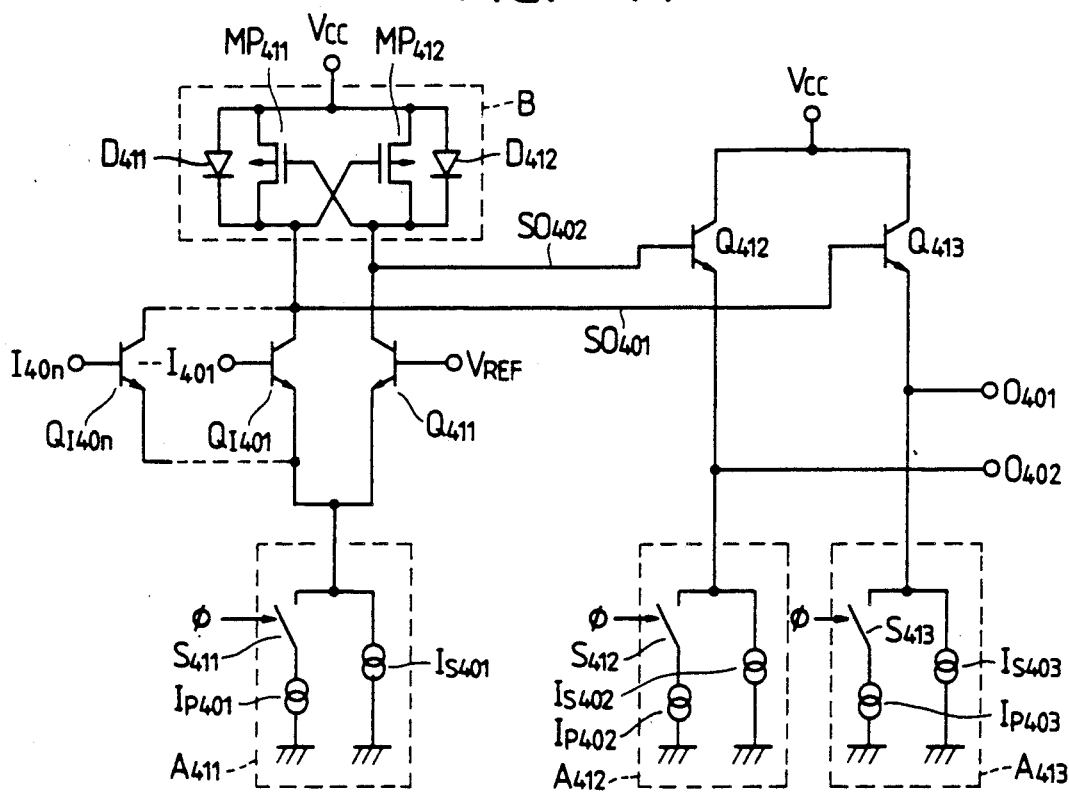
Figure 15:
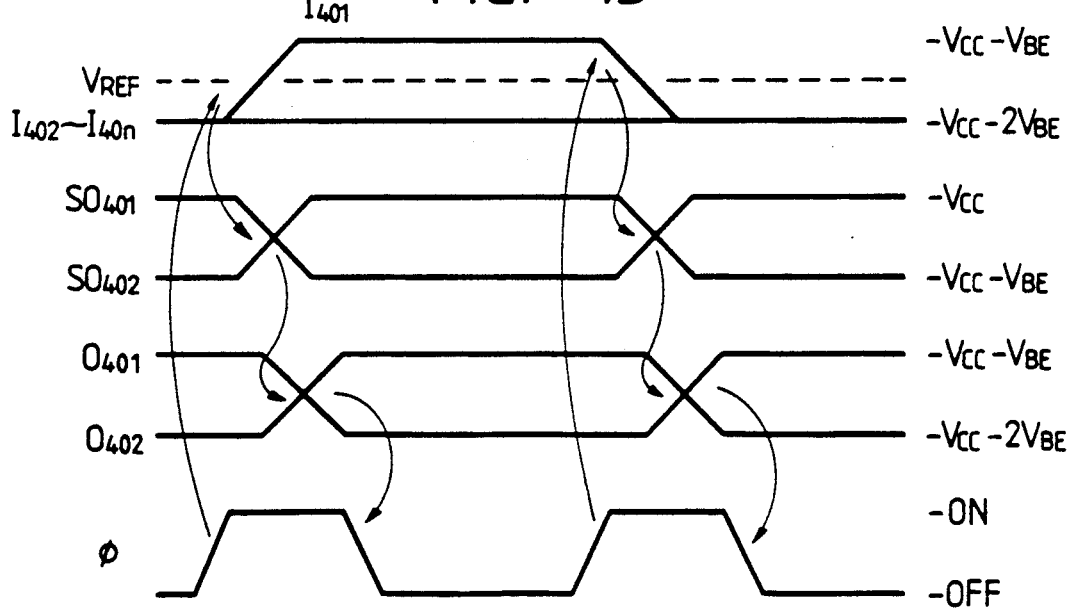
FIG. 15 is a graph showing the changes of voltages and currents in order to elucidate the operation of the semiconductor circuit illustrated in FIG. 14.

EMBODIMENT 7:

FIG. 14 shows another embodiment of the present invention. Here, the current source circuit A$_{411}$ of a current switch configured of transistors Q$_{I401}$, . . . , Q$_{I40n}$ and Q$_{411}$ and the current source circuits A$_{412}$ and A$_{413}$ of respective emitter followers Q$_{412}$ and Q$_{413}$ are circuits in which, when the current switch and the emitter followers operate, switches S$_{411}$, S$_{412}$ and S$_{413}$ are turned "on" by a signal $\emptyset$, whereby both current sources I$_{Si}$ and I$_{Pi}$ (i=401, 402, 403) are operated to cause great currents to flow, and in which, when the current switch and the emitter followers stand by, the switches are turned "off" by the signal $\emptyset$, whereby small currents are caused to flow by only the current sources I$_{Si}$. The magnitude of the currents of the current sources I$_{Si}$ is set at 1/10–1/1000 of the magnitude of the currents of the current sources I$_{Pi}$. Letter B indicates a circuit which holds the high level and low level of the voltages of the outputs SO$_{401}$ and SO$_{402}$ of the current switch substantially constant irrespective of such changes of the currents. The circuit B is so arranged that the gate of each of two P-channel MOS transistors MP$_{411}$ and MP$_{412}$ having common sources is connected to the drain of the other transistor, and that diodes D$_{411}$ and D$_{412}$ are connected in parallel with the respective transistors as depicted in the figure. This embodiment forms n-input NOR logic which includes a reference voltage V$_{REF}$ and n inputs I$_{401}$–I$_{40n}$. Symbol V$_{CC}$ denotes a supply voltage, the value of which shall be assumed plus (for example, 5 V) in the description. Incidentally, the signal $\emptyset$ may be generated either outside a chip or inside it. The operation of this circuit will be described with reference to a timing chart in FIG. 15. By way of example, input levels are set at (V$_{CC}$−V$_{BE}$) as a high level and at (V$_{CC}$−2 V$_{BE}$) as a low level; where V$_{BE}$ denotes the base-emitter forward voltage of each of the current switching bipolar transistors. At first, all the inputs are set at the low level (V$_{CC}$−2 V$_{BE}$), and the reference voltage V$_{REF}$ is set at the middle value of the high level and low level of the inputs. The switches S$_{411}$, S$_{412}$ and S$_{413}$ are turned "off" by the signal $\emptyset$, and the emitter currents are caused to flow by only the current sources I$_{Si}$. On this occasion, the transistors Q$_{I401}$, . . . and Q$_{I402}$ are nonconductive, and the transistor Q$_{411}$ is conductive. The voltage of the output SO$_{402}$ is made (V$_{CC}$−V$_{BE}$) by the diode D$_{412}$, while that of the output SO$_{401}$ is made the supply voltage V$_{CC}$ by the turn-on of the P-channel MOS transistor MP$_{411}$. Here, it is assumed that the threshold voltage of each of the MOS transistors is lower than the voltage V$_{BE}$. The P-channel MOS transistor MP$_{412}$ connected to the output SO$_{402}$ is turned "off" because the voltage V$_{CC}$ is applied to the source and gate thereof. In addition, since no current flows through the diode D$_{411}$ connected to the output SO$_{401}$, the V$_{BE}$ drop is zero. The voltage levels of the outputs SO$_{401}$ and SO$_{402}$ are shifted by the respective emitter followers Q$_{413}$ and Q$_{412}$, and respective outputs O$_{401}$ and Q$_{402}$ become (V$_{CC}$−V$_{BE}$) and (V$_{CC}$−2 V$_{BE}$), which are identical to the input levels. In the operating mode, the switches are first turned "on" by the control pulse $\emptyset$, to start causing the currents to flow by means of the great current sources I$_{Pi}$ in addition to the minute current sources I$_{Si}$ for the standby mode. Subsequently, the logic inputs change. Here will be exemplified a case where only the input I$_{401}$ changes. When the input I$_{401}$ changes from the low potential to the high potential and becomes higher than the voltage V$_{REF}$, the transistor Q$_{I401}$ is rendered conductive, and the current caused to flow by the current source circuit A$_{411}$ is switched so as to be diverted from the transistor Q$_{411}$ to the transistor Q$_{I401}$, thereby to lower the voltage of the output SO$_{401}$ and to raise that of the output SO$_{402}$. On this occasion, the current caused to flow by the circuit A$_{411}$ is sufficiently great, so that the state of the circuit B is also inverted. The resulting signals of the outputs SO$_{401}$ and SO$_{402}$ are respectively delivered to the outputs O$_{401}$ and O$_{402}$ by the emitter followers Q$_{413}$ and Q$_{412}$. Since, at this time, the switches S$_{412}$ and S$_{413}$ are respectively turned "on" in the current source circuits A$_{412}$ and A$_{413}$, the great emitter-follower currents can be caused to flow, and the load driving abilities of the outputs are enhanced. When the signals of the outputs O$_{401}$ and O$_{402}$ are changed-over, the signal $\emptyset$ changes to turn "off" the switches S$_{411}$, S$_{412}$ and S$_{413}$. In consequence, the current source circuits A$_{411}$, A$_{412}$ and A$_{413}$ start causing only the minute currents I$_{Si}$ to flow. Even when the currents decrease to 1/10–1/1000 in this manner, changes in the voltages V$_{BE}$ of the diodes of the circuit B and the bipolar transistors of the emitter followers can be suppressed to 60 mV–180 mV in accordance with Eq. (4) mentioned before. As a result, the potential fluctuations of the outputs SO$_{401}$, SO$_{402}$, O$_{401}$ and O$_{402}$ can be made as small as 60 mV–180 mV. Since the potential fluctuations to this extent are satisfactorily allowable for the design of a circuit at the succeding stage, the minute currents stated above suffice in the standby mode, and the power consumption can be sharply reduced. In this manner, in the present invention, the load circuit whose output amplitude is narrow and with which the output voltage levels become difficult to fluctuate even when the operating currents are switched is disposed, whereby a high-speed semiconductor circuit of small amplitude and low power consumption can be realized. In addition, the operation proceeds similarly when the input I$_{401}$ changes from the high potential to the low potential. More specifically, first of all, the signal $\emptyset$ is changed, and the switches S$_{411}$, S$_{412}$ and S$_{413}$ are turned "on" to start causing the great currents to flow by means of the current sources I$_{Pi}$ and I$_{Si}$. Subsequently, when the input I$_{401}$ changes from the high level to the low level and becomes the voltage lower than the reference voltage V$_{REF}$, the transistor Q$_{I401}$ is cut off, and the current begins to flow through the transistor Q$_{411}$, to lower the voltage of the output SO$_{402}$ and to raise that of the output SO$_{401}$. The voltage of the output SO$_{402}$ is brought to (V$_{CC}$−V$_{BE}$) by the diode D$_{412}$, while the voltage of the output SO$_{401}$ is brought to V$_{CC}$ by the P-channel MOS transistor MP$_{411}$. On this occasion, the P-channel MOS transistor MP$_{412}$ whose drain is connected to the output SO$_{402}$ is turned "off" because the supply voltage V$_{CC}$ is applied to both the source and gate thereof, and since no current flows through the diode $D_{411}$ connected to the output $SO_{401}$, no voltage drop develops. The signals of the outputs $SO_{401}$ and $SO_{402}$ are respectively rendered the signals of the outputs $O_{401}$ and $O_{402}$ by the emitter followers $Q_{413}$ and $Q_{412}$.

Figure 16:
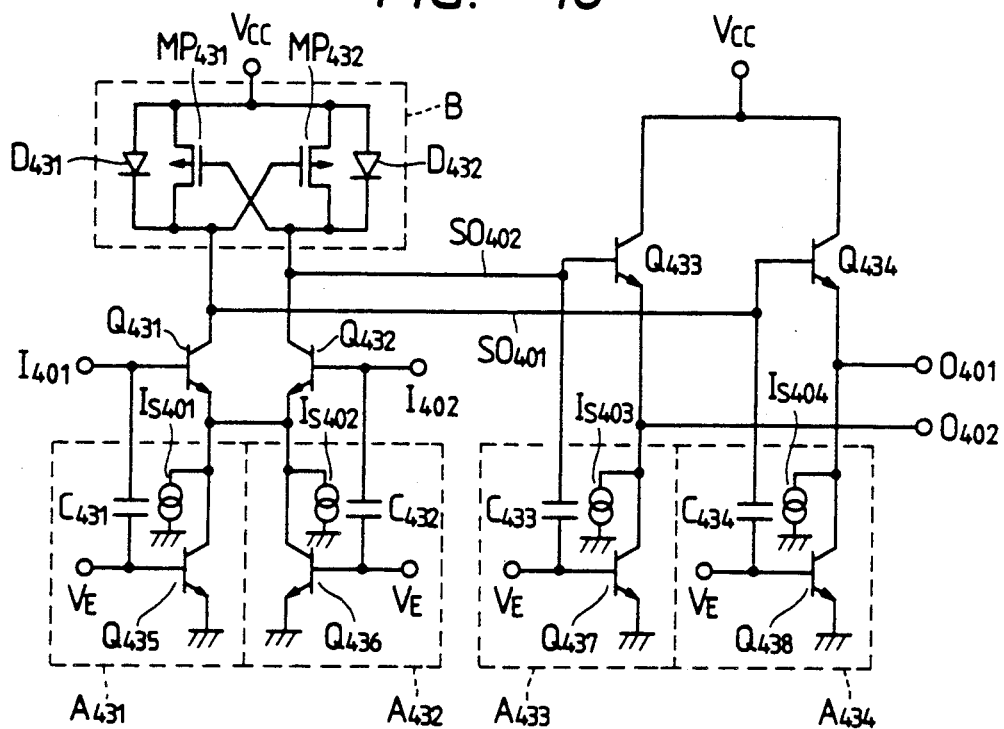
Figure 17:
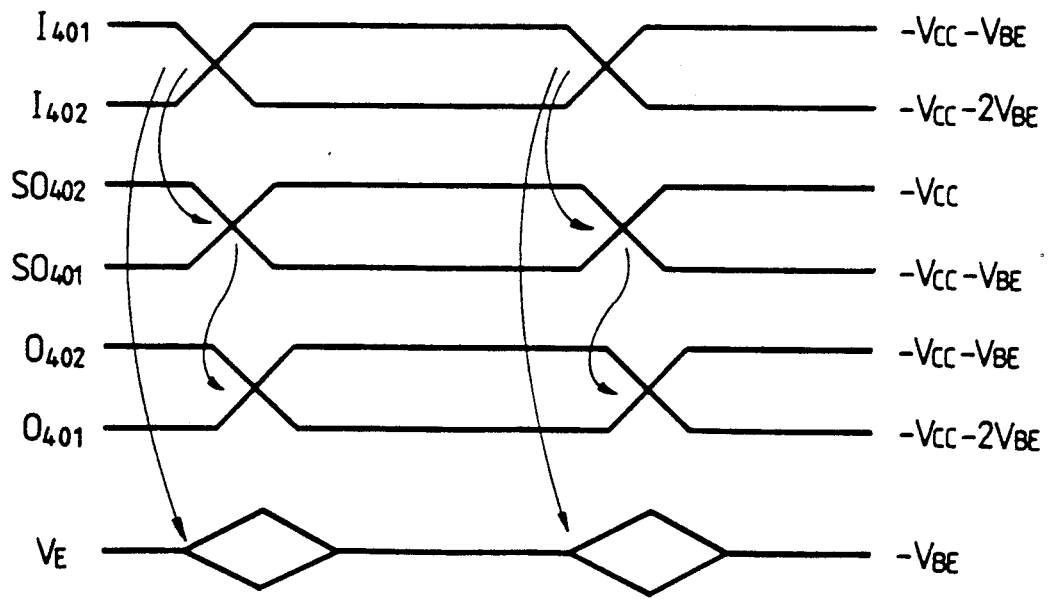
FIG. 17 is a graph showing the changes of voltages and currents in order to elucidate the operation of the semiconductor circuit illustrated in FIG. 16.

EMBODIMENT 8:

FIG. 16 is a diagram of a semiconductor circuit showing another embodiment of the present invention, while FIG. 17 is a diagram for explaining the operation of this circuit. The feature of the embodiment in FIG. 16 consists in that input signals are differential inputs $I_{401}$ and $I_{402}$, and that the current controls of current sources are automatically performed by utilizing the time variations of the input signals instead of the control pulse $\emptyset$. To this end, each of current source circuits $A_{43i}$ (i=1-4) is configured of a current source $I_{S40i}$ for a current of small value which is normally caused to flow, a bipolar transistor, and a capacitor. It is assumed that, initially, the input $I_{401}$ is at its high level having a voltage $(V_{CC}-V_{BE})$, while the input $I_{402}$ is at its low level having a voltage $(V_{CC}-2V_{BE})$. Therefore, a switching transistor $Q_{431}$ is turned "on," whereas a switching transistor $Q_{432}$ is cut off. As in the description of the embodiment in FIG. 14, a circuit B brings the voltage of an output $SO_{401}$ to $(V_{CC}-V_{BE})$ and the voltage of an output $SO_{402}$ to $V_{CC}$. The voltages of outputs $O_{401}$ and $O_{402}$ are $(V_{CC}-2V_{BE})$ and $(V_{CC}-V_{BE})$ into which the voltages of the outputs $SO_{401}$ and $SO_{402}$ are lowered by the voltage $V_{BE}$ by means of emitter followers $Q_{434}$ and $Q_{433}$, respectively. On this occasion, assuming that the base voltage $V_E$ of the bipolar transistor in each of the circuits $A_{43i}$ is the constant voltage $V_{BE}$, this bipolar transistor is substantially in its "off" state, and the current is kept flowing by only the current source $I_{Si}$. Subsequently, when the input $I_{401}$ changes from the high level to the low level and the input $I_{402}$ from the low level to the high level, the transistor $Q_{431}$ is cut off, and the transistor $Q_{432}$ is turned on. At the same time, the change of the input $I_{401}$ is transmitted to the base of the bipolar transistor $Q_{435}$ by the capacitor $C_{431}$, to lower the voltage of this base, whereas the voltage of the base of the bipolar transistor $Q_{436}$ is raised by the capacitor $C_{432}$. Therefore, the transistor $Q_{435}$ remains "off," but the transistor $Q_{436}$ turns "on" and can cause a great emitter current to flow. This is equivalent to the situation that, in the embodiment of FIG. 14, the switch is turned "on" by the signal $\emptyset$ so as to operate the current source $I_{P40i}$. Thus, the voltage of the output $SO_{401}$ rises to become $V_{CC}$, and that of the output $SO_{402}$ lowers to become $(V_{CC}-V_{BE})$, so that the circuit B is inverted. These signals of the outputs $SO_{401}$ and $SO_{402}$ are transmitted to the emitter followers. The same circuit form can be used also for the current source circuits $A_{433}$ and $A_{434}$ of the emitter followers. Therefore, while the driving abilities of the emitter followers are enhanced, the output $O_{401}$ rises to $(V_{CC}-V_{BE})$, and the output $O_{402}$ lowers to $(V_{CC}-2V_{BE})$. The current source circuit is designed beforehand so that, when the change of the base voltage of the bipolar transistor based on the capacitor coupling ends, the voltage $V_E$ may return to the value of the constant voltage $V_{BE}$. Then, the initial state is restored, and only the small current sources $I_{S40i}$ operate. Here, by appropriately selecting the capacitances of the capacitors $C_{43i}$, a high-speed semiconductor circuit of small amplitude and low power consumption can be realized without the special external signal $\emptyset$. The operation proceeds similarly in a case where the input $I_{401}$ changes from the high level to the low level, while the input $I_{402}$ changes from the low level to the high level.

In this embodiment, minute currents are caused to flow by the transistors $Q_{435}$, $Q_{436}$, $Q_{437}$ and $Q_{438}$ in the standby mode, so that the current sources $I_{S40i}$ are not always necessary.

Figure 18:
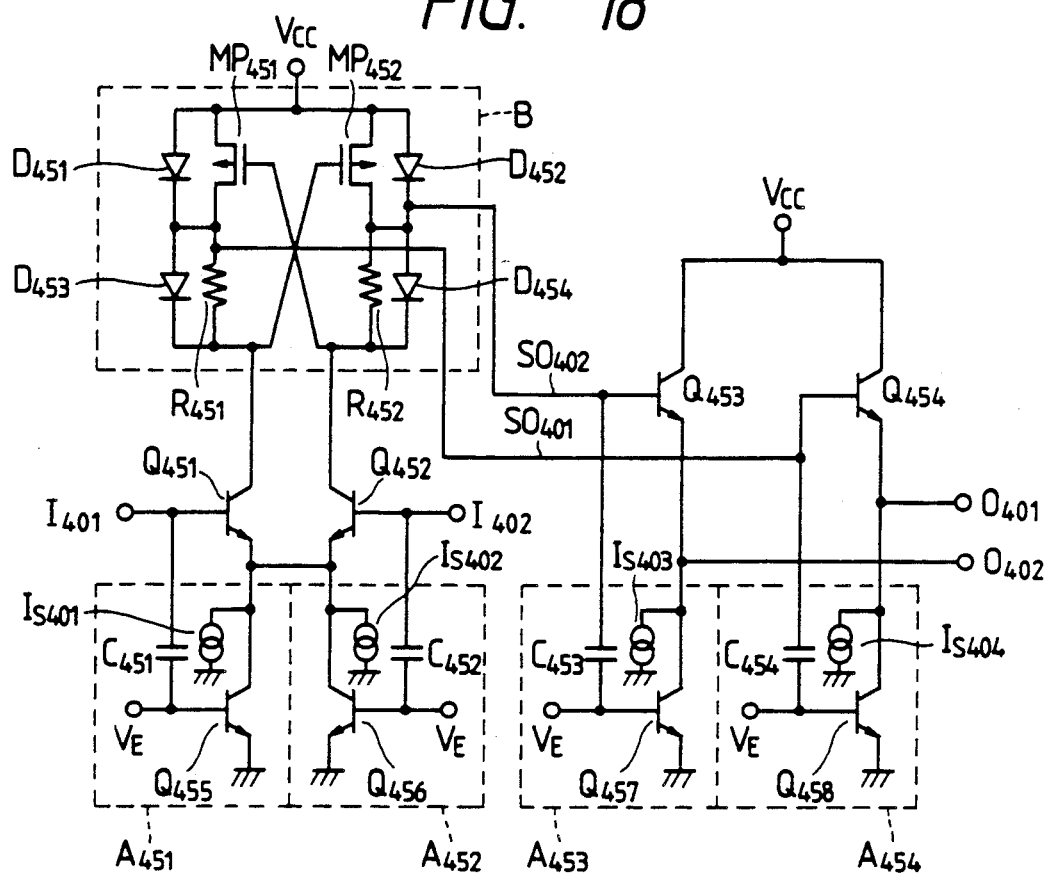

EMBODIMENT 9:

FIG. 18 shows an embodiment of the present invention as improves the embodiment in FIG. 16. In a circuit B, in series with a P-channel MOS transistor $MP_{451}$ and a diode $D_{451}$ which are connected in parallel, there are connected a resistance $R_{451}$ and a diode $D_{453}$ which are also connected in parallel, and in series with elements $MP_{452}$ and $D_{452}$ which are connected in parallel, there are connected elements $R_{452}$ and $D_{454}$ which are also connected in parallel. Further, in the transistors $MP_{451}$ and $MP_{452}$ whose sources are made common, the transistor $MP_{451}$ has its gate connected with one end of the resistance $R_{452}$ as depicted in the figure, and the transistor $MP_{452}$ has its gate connected to one end of the resistance $R_{451}$ as depicted in the figure, whereupon switch outputs $SO_{401}$ and $SO_{402}$ are respectively derived from the drains of the transistors $MP_{451}$ and $MP_{452}$. Thus, assuming by way of example that an input $I_{401}$ changes from a low level to a high level, while an input $I_{402}$ changes from the high level to the low level, and that a bipolar transistor $Q_{451}$ turns "on" and causes a current to flow, a voltage $(V_{CC}-2V_{BE})$ is temporarily applied to the gate of the transistor $MP_{452}$ because the diodes $D_{451}$ and $D_{453}$ turn "on." Accordingly, as compared with the method of FIG. 16 in which only the voltage $(V_{CC}-V_{BE})$ is applied, the method of this embodiment can heighten the driving ability of the transistor $MP_{452}$ and quicken the switching of the output $SO_{402}$. The P-channel MOS transistor is lower in the driving ability than the bipolar transistor. The driving ability of the P-channel MOS transistor is therefore enhanced by this method, and the output $SO_{402}$ can be raised at a speed equal to the speed of lowering the output $SO_{401}$ as determined by the bipolar transistor $Q_{451}$.

Figure 19:
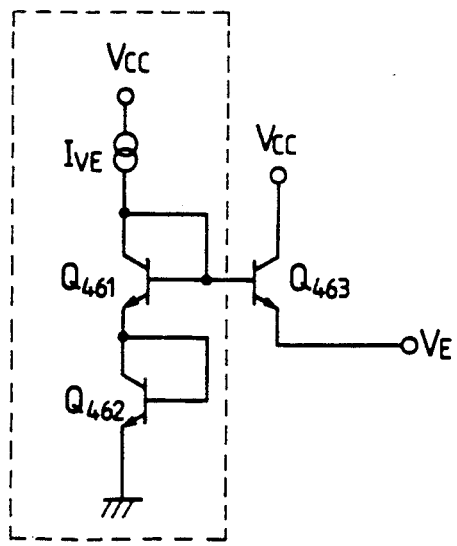
FIG. 19 is a circuit arrangement diagram showing a regulated-voltage generator for use in the semiconductor circuit illustrated in FIG. 16 or FIG. 18.

FIG. 19 shows an embodiment of a circuit for generating the regulated voltage $V_E$ which is applied to the base of the bipolar transistor in the current source circuit A used in the embodiment of FIG. 16 or FIG. 18. The base of a bipolar transistor $Q_{463}$ is clamped to ($2V_{BE}$) by bipolar transistors $Q_{461}$, $Q_{462}$ and a current source $I_{VE}$, and the regulated voltage equal to $V_{BE}$ is applied to the terminal $V_E$. When the voltage of the terminal $V_E$ is transiently rendered lower than $V_{BE}$ by the operation of the circuit in FIG. 16 or FIG. 18, current is caused to flow by the transistor $Q_{463}$ so that the $V_E$ voltage may become $V_{BE}$. On the contrary, when the voltage of the terminal $V_E$ is rendered higher than $V_{BE}$ by the capacitor coupling, the transistor $Q_{463}$ operates toward its cutoff state, and the boosting effect thereof increases. However, charges corresponding to a voltage difference $(V_E-V_{BE})$ are dissipated as the base charges of the bipolar transistor whose base has the voltage $V_E$ applied thereto. Eventually, the waveform of the voltage $V_E$ becomes as illustrated in FIG. 17. It is to be added that, although the transistors $Q_{463}$ are required for the respective current source circuits A, the remaining circuit enclosed with a broken line in FIG. 19 can also be shared.

Figure 20A:
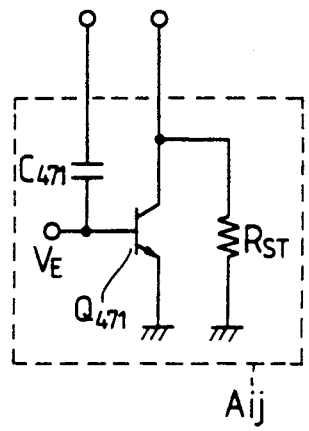
FIG. 20a and FIG. 20b are circuit arrangement diagrams each showing a current source for a minute current.
Figure 20B:
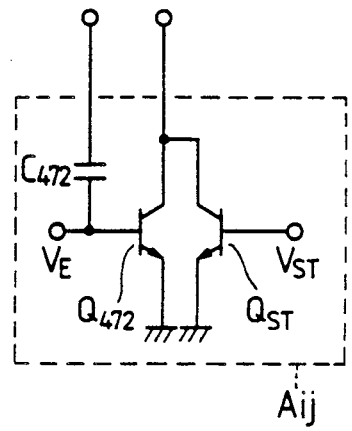

FIGS. 20a and 20b are diagrams each showing an embodiment of the current source $I_{S40i}$ of the current source circuit A for the current of minute value which is normally caused to flow. In order to facilitate understanding, however, the circuit for the current $I_{P40i}$ as shown in FIG. 16 or FIG. 18 is also illustrated. In the example of FIG. 20a, the current source $I_{S40i}$ is constructed of a resistance $R_{St}$, and the minute current can be caused to flow under the control of this resistance. In the example of FIG. 20b, the current source $I_{S40i}$ is constructed of a bipolar transistor $Q_{St}$, and the base voltage $V_{St}$ of this transistor is properly set. The minute current can be caused to flow by setting the base voltage in the vicinity of the voltage $V_{BE}$ by way of example.

Figure 21:
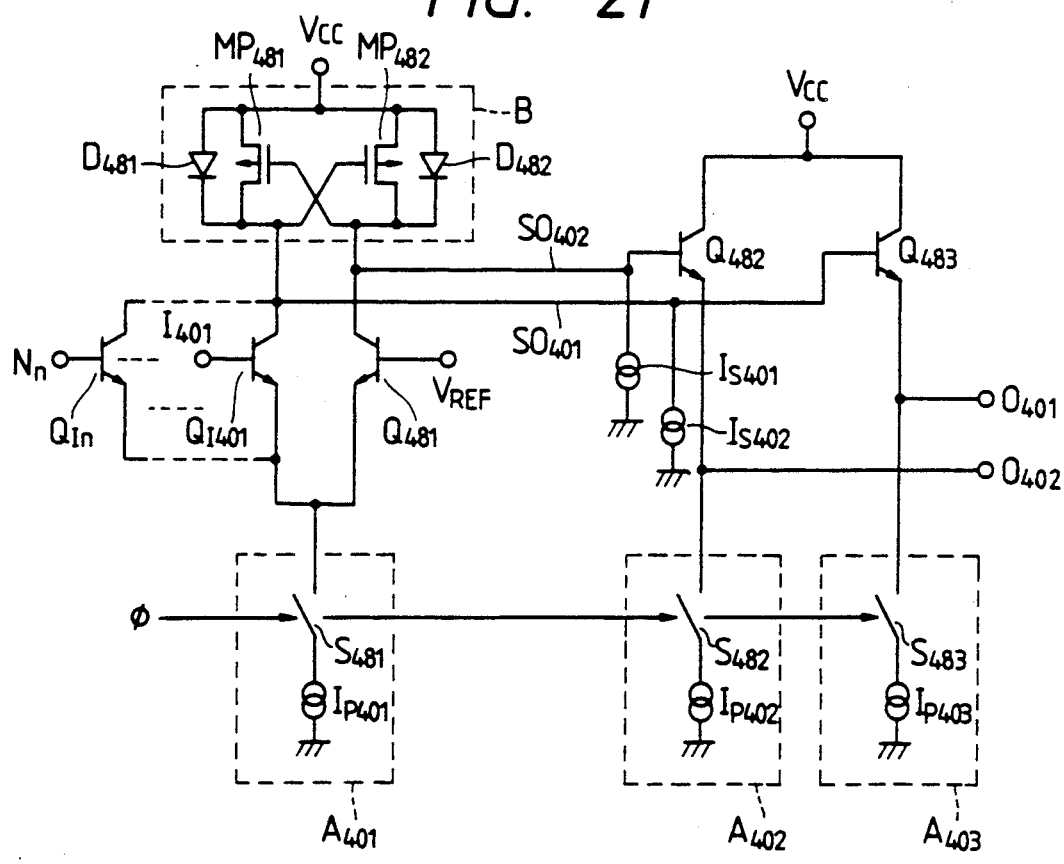
Figure 22:
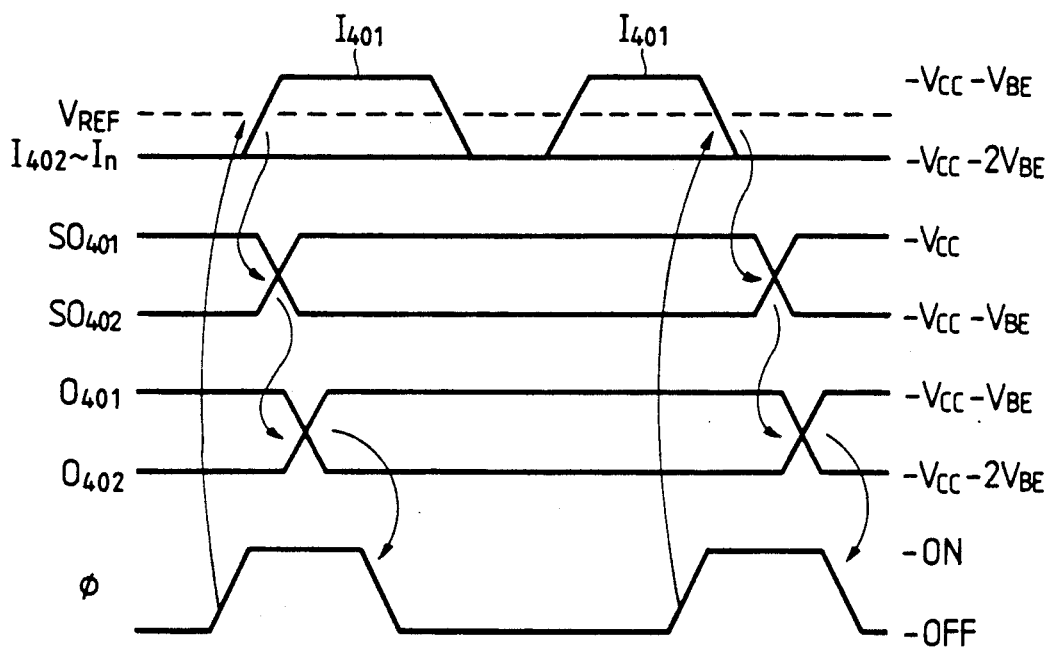
FIG. 22 is a graph showing the changes of voltages and currents in order to elucidate the operation of the semiconductor circuit illustrated in FIG. 21.

EMBODIMENT 10:

FIG. 21 is a circuit diagram showing another embodiment of the present invention. Letter B designates the same circuit as in FIG. 14 or FIG. 16. Each of current source circuits A is configured of a great current source $I_{P40i}$ (i=1-3), a switch $S_{48i}$ (i=1-3) which makes and breaks the connection between the current source $I_{P40i}$ and a current switching circuit or an emitter follower, and a control signal ∅ for the switch $S_{48i}$. In addition, minute current sources $I_{S401}$ and $I_{S402}$ are respectively connected to switch outputs $SO_{402}$ and $SO_{401}$. FIG. 22 is a diagram for explaining the operation of the circuit in FIG. 21, and the feature of this embodiment will be described with reference to FIG. 22. As an example, there will be taken a case where all inputs are initially at a low level and where only one input $I_{401}$ changes. First, the switches $S_{481}$, $S_{482}$ and $S_{483}$ are turned "on" by the signal ∅, to connect the great current sources $I_{P401}$, $I_{P402}$ and $I_{P403}$ with the corresponding ones of the current switching circuit and the emitter followers. Subsequently, when the input $I_{401}$ changes from the low level to a high level, the switch outputs $SO_{401}$ and $SO_{402}$ are changed-over, and outputs $O_{401}$ and $O_{402}$ are consequently changed-over. When the above ends, the switches $S_{481}$, $S_{482}$ and $S_{483}$ are turned "off." Even when these switches are turned "off," the signal levels of the outputs $SO_{401}$ and $SO_{402}$ are held by the circuit B and the minute currents $I_{S401}$, $I_{S402}$. This embodiment has the advantage that, even when the input $I_{401}$ changes with the signal ∅ in its "off" state, the outputs $O_{401}$ and $O_{402}$ remain unchanged as illustrated in FIG. 22. This is based on the fact that the minute current sources $I_{S401}$ and $I_{S402}$ are respectively connected to the outputs $SO_{402}$ and $SO_{401}$ and hold the signal levels in cooperation with the circuit B, and that, unless the current switching circuit and the emitter followers are connected with the great current sources $I_{P401}$, $I_{P402}$ and $I_{P403}$ by the signal ∅, current to flow through a bipolar transistor $Q_{I401}$ does not change in spite of the input $I_{401}$. When the signal ∅ turns "on" again, the change of the input $I_{401}$ changes-over the outputs $SO_{401}$, $SO_{402}$ and then changes-over the outputs $O_{401}$, $O_{402}$ as illustrated in FIG. 22. In this embodiment, it is also possible to employ the circuit B shown in FIG. 18.

Although, in the above, the supply voltage $V_{CC}$ has been described as being plus, an ECL interface circuit can also be realized by replacing the voltage $V_{CC}$ with 0 V and the ground potential with $-5.2$ V or $-4.5$ V. In this case, the high level and low level of the inputs and outputs are $-V_{BE}$ and $-2 V_{BE}$, respectively.

Besides, although all the embodiments in FIG. 14, FIG. 16, FIG. 18 and FIG. 21 have been described as the BiCMOS circuits, similar effects can be expected even when MOS transistors are substituted for the bipolar transistors in the embodiments.

The high-speed semiconductor circuit of small amplitude and low power consumption according to the present invention is considered to be applied to various products. In particular, it is well suited to the peripheral circuits of a dynamic semiconductor memory. By applying the present invention to the peripheral circuits (address buffers, read/write circuits, and timing generators) of the dynamic semiconductor memory of large capacity, a large-capacity dynamic semiconductor memory of high operating speed and low power consumption can be realized.

Figure 23:
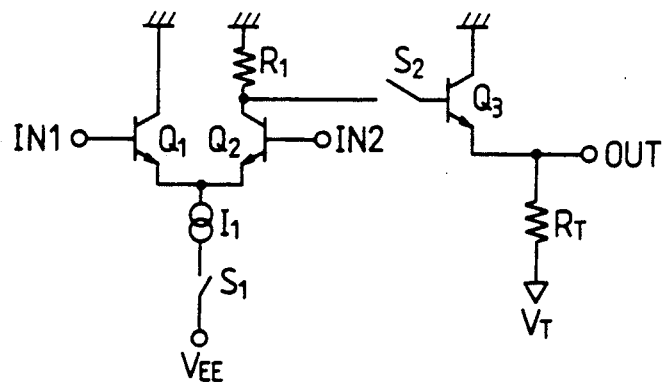

EMBODIMENT 11:

FIG. 23 is a diagram showing the operating principle of a circuit in another embodiment.

Figure 1:
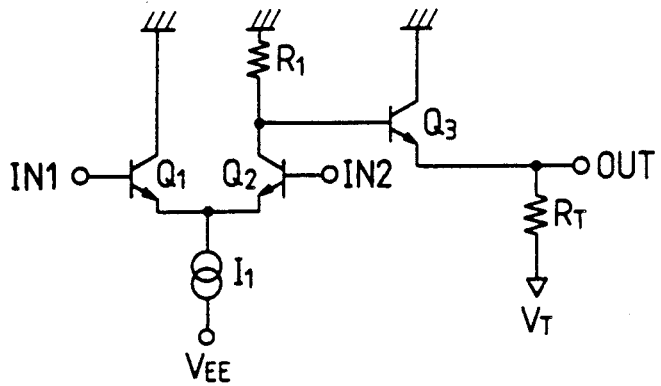
FIG. 1 is a schematic circuit arrangement diagram showing the fundamentals of an emitter-follower type ECL circuit in a prior art.
Figure 2:
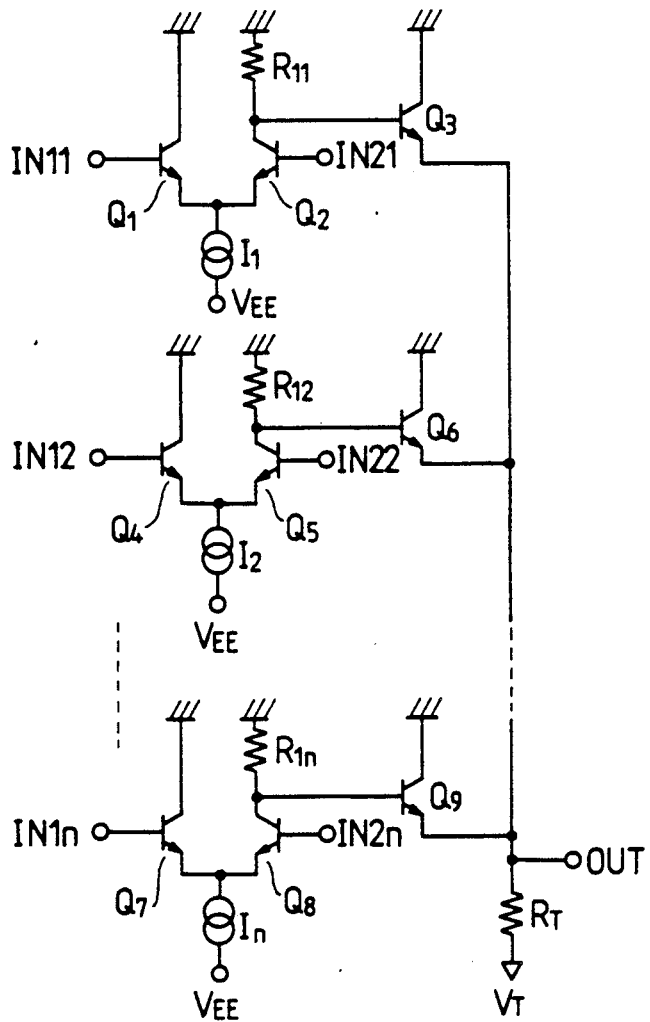
FIG. 2 is a circuit arrangement diagram of circuits are connected in parallel.
Figure 3:
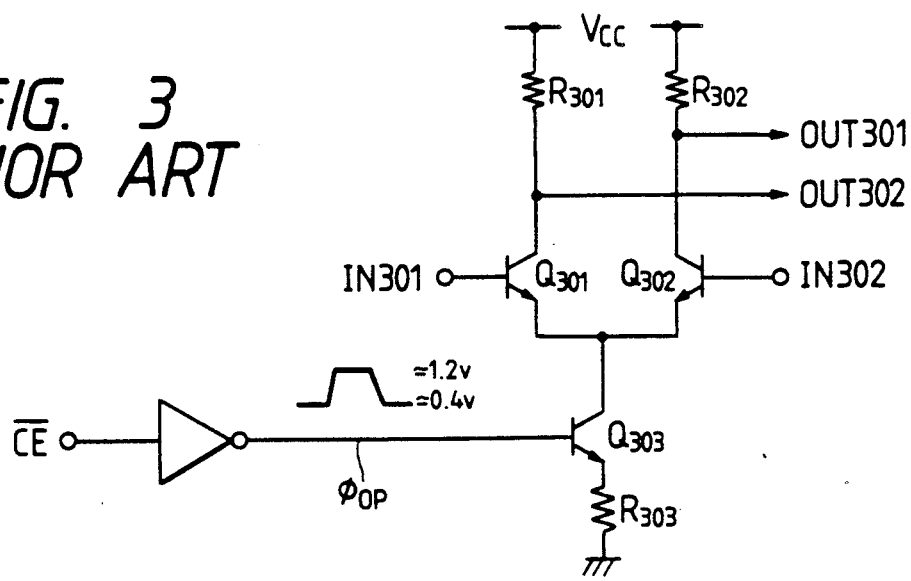
FIG. 3 is a schematic circuit arrangement diagram for explaining a prior-art method of controlling the current of an ECL circuit.
Figure 4:
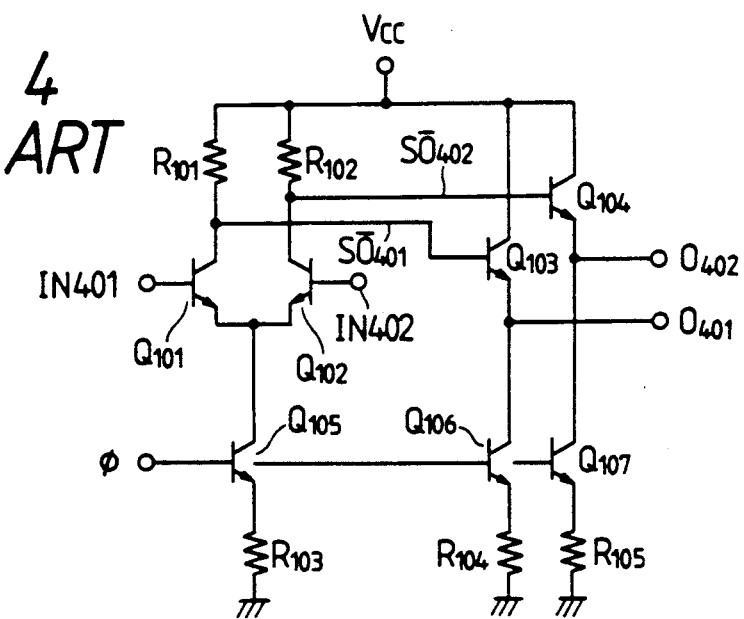
FIG. 4 is a schematic circuit arrangement diagram for explaining a prior-art method of controlling the currents of an emitter-follower type ECL circuit.

In FIG. 23, only one of a plurality of ECL circuits (each being configured of a current switch and an emitter follower) which are connected in parallel for a logical OR function is shown, and the others are omitted from the illustration, but all the other ECL circuits connected in parallel are identical in arrangement to the ECL circuit shown in FIG. 23. As compared with the prior-art circuit shown in FIG. 1, this embodiment is novel in that switches $S_1$ and $S_2$ are added.

When the circuit in FIG. 23 is not selected, both the switches $S_1$ and $S_2$ are turned "off," thereby to cut off the current of the current switch and to turn "off" the emitter follower. Thus, in the nonselected state of the circuit, no current flows irrespective of inputs IN1 and IN2, so that no power is consumed in the circuit. Besides, the potential of an output OUT becomes the value of a terminating voltage $V_T$ through a terminating resistance $R_T$.

On the other hand, when the circuit is selected, the switches $S_1$ and $S_2$ are turned "on," thereby to cause the current of the current switch to flow and to turn "on" the emitter follower. As the output in this case, a potential '1' or '0' is obtained according to the inputs IN1 and IN2. The output potential becomes approximately $-V_{BE}$ for '1,' and $(-I_1 \times R_1 - V_{BE})$ for '0.' More specifically, when the output potential is '1,' the transistor $Q_1$ of the ECL circuit turns "on," and the transistor $Q_2$ thereof turns "off," so that current which flows through the load resistance $R_1$ of the current switch is almost zero. Accordingly, the output potential becomes the potential which is lower than the ground potential by the base-emitter forward voltage drop $V_{BE}$ of the transistor $Q_3$ of the emitter follower. In addition, when the output potential is '0,' the transistor $Q_2$ of the ECL circuit turns "on," and the transistor $Q_1$ thereof turns "off," so that the current $I_1$ of the current switch flows through the resistance $R_1$. Accordingly, the output potential becomes the potential which is lower than the ground potential by the sum between the voltage drop $(I_1 \times R_1)$ across the resistance $R_1$ and the base-emitter voltage drop $V_{BE}$ of the emitter-follower transistor $Q_3$.

When, in the logical sum (wired-OR) circuit in which the plurality of ECL circuits are connected in parallel, one ECL circuit is selected, the output '1' or '0' of the selected circuit is delivered, and the outputs of the other ECL circuits exert no influence on the output to be delivered, because the emitter-follower transistors $Q_3$ are turned "off."

Owing to such an arrangement, when the circuit is not selected, the low potential is obtained at the emitter-follower output with the consumptive current held null, so that the wired-OR connection is also permitted.

According to the construction of the present invention, in a construction wherein the logical sum is taken by connecting the large number of outputs of the memory LSIs or logic LSIs of a DRAM (Dynamic Random Access Memory), an SRAM (Static Random Access Memory) or the like as interfaced by ECL circuits, it can be taken likewise to the prior art while nonselected ones of the LSIs are held at low currents. Accordingly, the power consumption of the whole device can be lowered. The switches $S_1$ and $S_2$ of the ECL circuits may be controlled using the chip enable signal ($\overline{CE}$) of the LSIs, or $\overline{RAS}$ signal especially in the DRAM.

Figure 24:
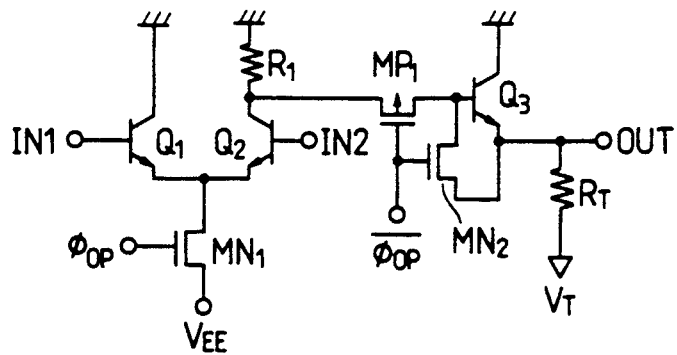

FIG. 24 is a circuit diagram showing a practicable example of the embodiment of the present invention in FIG. 23.

In the example of FIG. 24, the switch $S_1$ and the current source of the current switch are constructed of an n-MOS transistor MN1, and the switch $S_2$ is constructed of a p-MOS transistor MP1. These MOS transistors MN1 and MP1 are controlled by control voltages $\phi_{OP}$ and $\overline{\phi}_{OP}$. When the ECL circuit is not selected, the signal $\phi_{OP}$ is set at a low potential, and the signal $\overline{\phi}_{OP}$ is set at a high potential, thereby to turn "off" both the transistors MN1 and MP1. In this way, while the current of the current switch is held null, the low potential output of the terminating voltage $V_T$ is obtained at the output OUT. In addition, an n-MOS transistor MN2 connected in parallel with the emitter-follower transistor $Q_3$ across the base and emitter thereof serves to prevent the base potential of the transistor $Q_3$ from falling into a floating state when the ECL circuit is not selected. The transistor MN2 is inserted between the base and a voltage $V_{EE}$ in the illustration, but it may well be inserted between the base and the voltage $V_T$.

On the other hand, when the ECL circuit is selected, the signal $\phi_{OP}$ is set at the high potential, and the signal $\overline{\phi}_{OP}$ is set at the low potential. Thus, the current of the current switch is caused to flow through the transistor MN1, while the base current of the emitter-follower transistor $Q_3$ is caused to flow through the transistor MP1, and the potential of the output OUT corresponding to the inputs IN1 and IN2 is produced.

Figure 25:
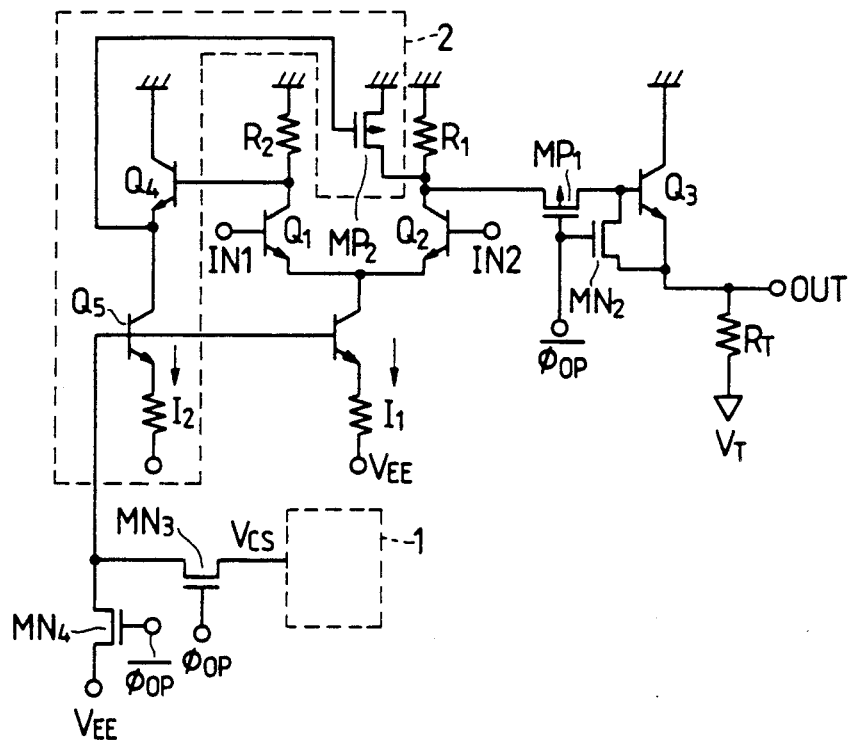

FIG. 25 is an arrangement diagram of a circuit showing a modified embodiment of the embodiment in FIG. 24.

Referring to FIG. 25, a constant-current source in which a bipolar transistor and a resistance are combined is employed for the current of the current switch. A circuit block 1 enclosed with a broken line is a circuit which generates a voltage $V_{CS}$ to be applied to the base of the bipolar transistor for the constant-current source. In addition, a circuit block 2 includes a p-MOS transistor MP2 which is inserted in parallel with the load resistance ($R_1$) and the negation side emitter-follower circuit ($Q_4$, $Q_5$) of the output OUT, and it serves to raise the high potential of the output as will be described later. That is, the circuit block 2 is such that the next embodiment 12 (FIGS. 26–29) is assembled in the embodiment 11. Accordingly, the circuit block 2 will be described in more detail in Embodiment 12.

The operation of the circuit in FIG. 25 will be briefly explained. When the ECL circuit stands by, the control voltage $\phi_{OP}$ becomes the low potential, and the control voltage $\overline{\phi}_{OP}$ becomes the high potential as in the case of FIG. 24, so that the base voltages of the current sources of the current switch and the emitter follower become zero. Therefore, the current $I_1$ of the current switch and the current $I_2$ of the emitter follower become zero. Besides, since the transistors MP1 and $Q_3$ are "off," the value equal to the terminating voltage $V_T$ is obtained at the output OUT.

On the other hand, when the ECL circuit operates, the control voltage $\phi_{OP}$ becomes the high potential, and the control voltage $\overline{\phi}_{OP}$ the low potential, so that a transistor MN3 and the transistor MP1 turn "on," and predetermined currents $I_1$ and $I_2$ flow through the current switch and the added emitter-follower transistor $Q_4$, respectively. Accordingly, the value of the output OUT corresponding to the inputs IN1 and IN2 can be obtained. The function of the circuit block 2 enclosed with a broken line is to raise the high potential of the output OUT in the operating mode. Now, when the input voltage IN1 is higher than the input voltage IN2, '1' at the high potential is provided at the output OUT. Herein, when the current value $I_1$ of the current switch is set small in order to reduce the consumptive current, the load resistance $R_1$ for producing a fixed output amplitude is inevitably increased, and its voltage drop ascribable to the base current enlarges. As a result, the high potential of the output OUT lowers. Therefore, when the input IN1 is higher in potential than the input IN2, the gate potential of the transistor MP2 is lowered by the output of the additional emitter-follower transistor $Q_4$, thereby to turn "on" this transistor MP2. Then, an effective load resistance which is determined by the parallel resistance consisting of the load resistance $R_1$ and the "on" resistance of the transistor MP2 is lowered, to decrease the potential drop of the output transistor $Q_3$ attributed to the base current thereof. In this way, the high potential of the output OUT is raised.

Next, when the output OUT is at the low potential, the current $I_1$ does not flow through the transistor $Q_1$, and the gate potential of the transistor MP2 is heightened by the output of the emitter-follower transistor $Q_4$, so that this transistor MP2 is almost turned "off." As a result, the low potential of the output OUT is nearly equal to its value in the absence of the circuit block 2.

This embodiment has been described as controlling the gate voltage of the transistor MP2 with the emitter voltage of the transistor $Q_4$. It is also allowed, however, to omit the emitter-follower circuit configured of the transistors $Q_4$, $Q_5$ and a resistance and to control the gate voltage of the transistor MP2 with the collector voltage of the transistor $Q_1$. In this case, there is the advantage that the power consumption can be lowered still more.

Figure 26:
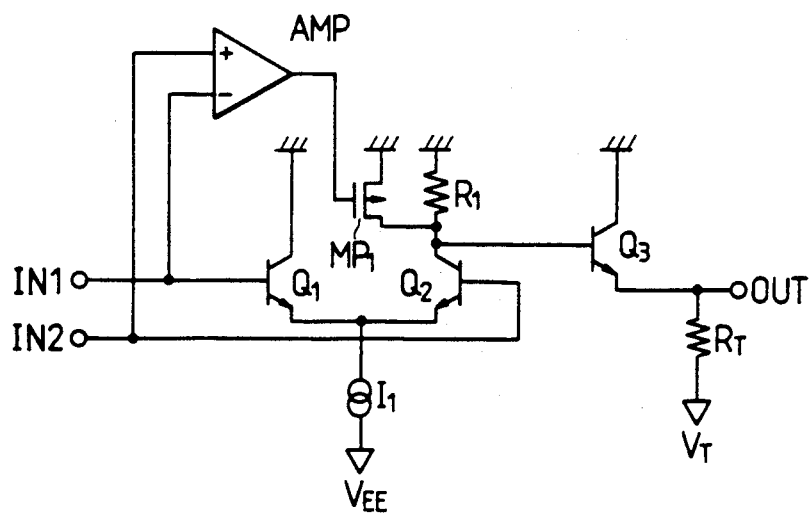

EMBODIMENT 12:

FIG. 26 is a fundamental arrangement diagram of an ECL circuit showing this embodiment.

In the arrangement of FIG. 26, a PMOS transistor MP1 is connected in parallel with the load resistance $R_1$ of the ECL circuit, and the gate thereof is controlled by the output of an amplifier AMP disposed separately from the ECL circuit. Thus, even when the current value $I_1$ of a current switch is set to be small, logic levels '1' and '0' satisfying predetermined ECL specifications can be delivered without lowering the high potential of an output OUT.

In a case where an input IN1 is higher in potential than an input IN2, a transistor $Q_1$ is turned "on," and a transistor $Q_2$ is turned "off." In addition, since the potential of the input IN1 is higher than that of the input IN2, the output of the amplifier AMP becomes a low potential and turns "on" the transistor MP1. In this way, an effective resistance lowers owing to the parallel connection of the resistance R₁ and the transistor MP1, so that the potential drop of a transistor Q₃ attributed to the base current thereof decreases. Accordingly, even when the value of the load resistance R₁ enlarges or the base current $I_B$ of the transistor Q₃ increases, the lowering of the high output potential $V_{OH}$ can be prevented.

Conversely, in a case where the input IN1 is lower in potential than the input IN2, the transistor Q₁ is turned "off," and the transistor Q₂ is turned "on." In addition, since the potential of the input IN1 is lower than that of the input IN2, the output of the amplifier AMP becomes a high potential, and the transistor MP1 is turned "off" or brought into a state close thereto. As a result, the current I₁ of the current switch flows mostly through only the resistance R₁, and a low output potential $V_{OL}$ becomes:

$$V_{OL} = -I_1 R_1 - I_{BL} R_1 - V_{BE}$$

as in the prior-art ECL circuit. Also in this case, the potential drop of the emitter-follower transistor Q₃ attributed to the base current $I_{BL}$ thereof is existent. However, when the output is the low voltage $V_{OL}$, $I_{OL} \approx 4$ mA holds under the terminating conditions of $V_T = -2.0$ V, $V_{OL} = -1.8$ V and $R_T = 50\Omega$, and the base current $(I_{BL} = I_{OL}/h_{FE})$ becomes small. Even if the output $V_{OL}$ lowers due to this potential drop, no problem will arise because the lowering leads to increase in an output amplitude $(V_{OH} - V_{OL})$, namely, increase in a circuit operation margin.

Owing to the circuit arrangement in FIG. 26, even when the current I₁ of the current switch is small and the load resistance R₁ is high, the lowering of the high output potential $V_{OH}$ can be checked by the effect of decreasing the equivalent resistance as based on the transistor MP1. On the other hand, as regards the low output potential $V_{OL}$, the circuit can be designed likewise to the prior-art ECL circuit with the effect of the transistor MP1 neglected.

Figure 27:
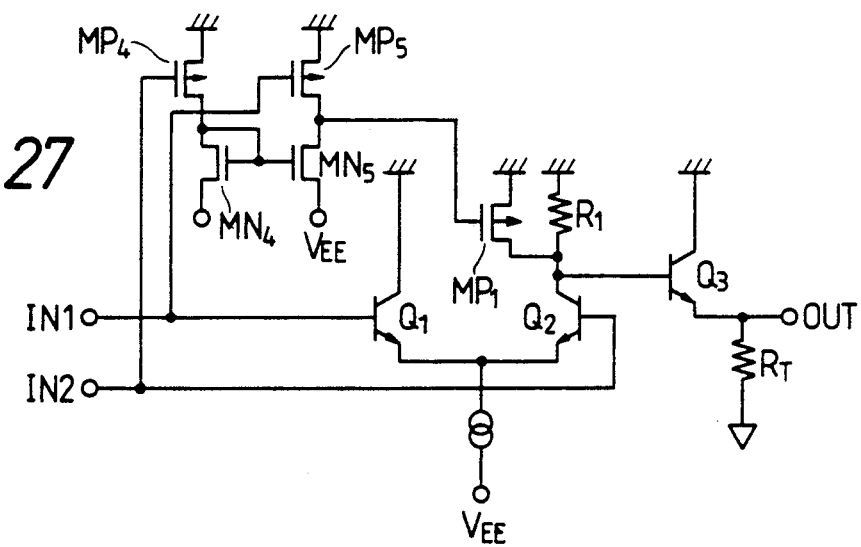

FIG. 27 is a circuit arrangement diagram showing a practicable example of the embodiment in FIG. 26.

In the example of FIG. 27, the amplifier AMP in FIG. 26 is constructed of a so-called current mirror circuit which is configured of p-MOS transistors MP4, MP5 and n-MOS transistors MN4, MN5. Since the output of the current mirror amplifier affords the level of perfectly 0 V ("high") or $V_{EE}$ ("low"), the transistor MP1 can be perfectly turned "on" and "off," and the effect of compensating the ECL output level as based on the transistor MP1 is great.

Figure 28:
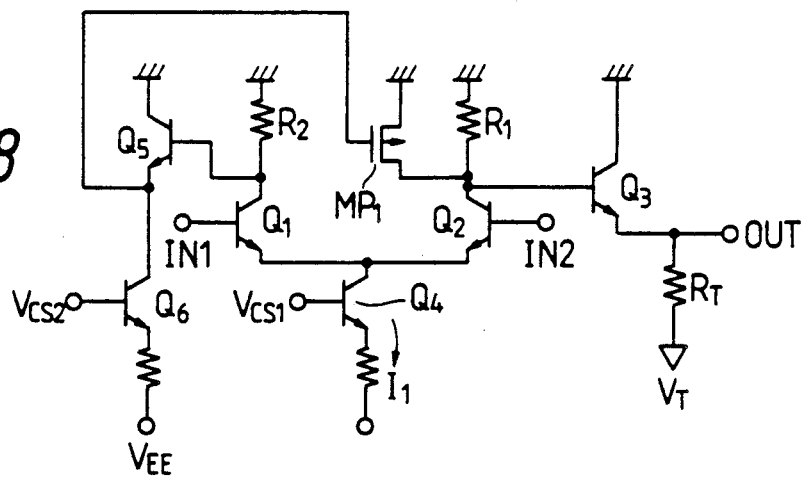

FIG. 28 is a circuit arrangement diagram showing another practicable example of the embodiment in FIG. 26. The amplifier AMP in FIG. 26 is constructed of a bipolar circuit, the circuit arrangement of which is the same as in the circuit block 2 in FIG. 25.

As already explained with reference to FIG. 25, in the embodiment of FIG. 28, the separate emitter-follower circuit (Q₅, Q₆) is provided on the negation side for the output of the ECL circuit, and its output is used for controlling the gate of the transistor MP1. Since, in this case, the gate voltage is the output of the bipolar circuit, the signal amplitude cannot be set so great as in the case of the circuit of FIG. 27, and hence, the transistor MP1 cannot be perfectly turned "on" and "off." However, this embodiment has the advantage that the response rate of the gate voltage is high. When the value of a resistance R₂ is set greater than the value of the resistance R₁ to the extent that the bipolar transistor Q₁ is not saturated, the change of the gate voltage of the transistor MP1 can also be enlarged, and hence, the "on" resistance of this transistor MP1 can be lowered more.

By way of example, the current of the current switch is set at I₁=2 mA, the resistances are set at R₁=500 Ω and R₂=750 Ω, the current gain of the bipolar transistor is set at $h_{FE}$=50, and the gate width and gate length of the MOS transistor MP1 are respectively set at 200 μm and 1.5 μm. Then, about 70 % of the base current at the generation of the output $V_{OH}$ flows through the transistor MP1, and about 30 % flows through the resistance R₁. Owing to the contribution of the transistor MP1, the output potential $V_{OH}$ can be rendered higher than in the absence of this transistor MP1 in a great amount of about 150 mV. Moreover, in spite of the addition of the transistor MP1, a delay time as the ECL circuit is hardly affected.

In this way, only the high potential output $V_{OH}$ can be improved without spoiling other characteristics. Besides, when the gate voltage of the transistor MP1 is directly controlled by the collector voltage of the transistor Q₁ as stated before, the current of the emitter follower can be saved.

Figure 29:
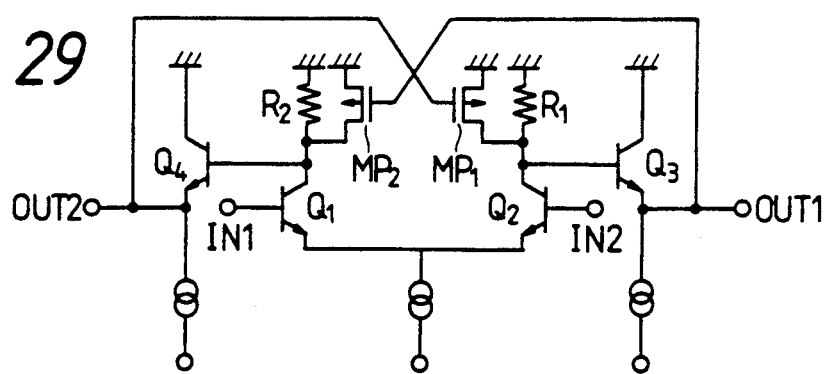

FIG. 29 is a circuit arrangement diagram showing a further modification of the embodiment in FIG. 28.

In the embodiment of FIG. 29, the circuit in FIG. 28 is further expanded, and p-MOS transistors are assembled in parallel with the load resistances of both the affirmation side and negation side of the ECL circuit. This example is well suited to derive the outputs on both the sides, and it consists in that the transistors MP1 and MP2 are respectively connected in parallel with the resistances R₁ and R₂ and are controlled by the outputs of the corresponding emitter followers. Thus, the same effects as in the embodiment of FIG. 28 can be achieved for the complementary outputs.

Principal symbols in the drawings are listed below:

$\overline{CE}$ ... chip enable input signal, $\overline{OE}$ ... output enable input signal, $\emptyset_{OP}$, $\emptyset_{OP}$, $\emptyset_L$, $\emptyset_L$, $\emptyset_{OE}$ ... pulse signals in chips, $V_G$ ... gate control voltage for MOS current source, $V_{CS}$ ... base control voltage for bipolar current source, $I_{401} - I_n$ ... inputs, $o_1$, $O_2$ ... outputs, $SO_1$, $SO_2$ ... current switch outputs, A ... current control circuit, B ... latch circuit, $\emptyset$ ... current control signal, $V_{CC}$ ... supply voltage, $V_{REF}$ ... reference voltage, $V_{EE}$ ... supply voltage, $V_{OL}$ ... low potential output, $V_{OH}$ ... high potential output, $h_{FE}$ ... current gain of bipolar transistor, $V_T$ ... terminating voltage, $R_T$ ... terminating resistance, $V_{BE}$ ... base-emitter forward potential drop of transistor, OUT ... output terminal, R₁ ... load resistance, Q₁ -Q₉, etc. ... bipolar transistors.

As thus far described, according to the present invention, an emitter-coupled logic (ECL) circuit or a differential amplifier circuit is operated with a great current and a low load resistance for the operating period of time in which inputs and an output are changed-over, and it is operated with a small current and a high load resistance for the standby period of time or the data retention period of time in which an output potential is merely held, so that while the inherent high operating speed of the circuit is maintained, the power consumption thereof can be simultaneously lowered. That is, according to the present invention, current is consumed substantially only in the operating mode of the circuit, so that the lower power consumption can be attained, and fluctuations in the levels of the internal and output voltages of the circuit can be suppressed.

Furthermore, according to the present invention, in a circuit wherein the emitter-follower outputs of a plurality of ECL circuits are connected by wired-OR logic, the base of each emitter-follower transistor and the current source of each current switch are respectively provided with switches, whereby the logical sum of the emitter-follower outputs can be taken while the consumptive currents of the ECL circuits in standby states are held null, so that the consumptive current of the whole logic circuit can be sharply reduced. Also in each individual ECL circuit, in a case where the current of the current switch is reduced and a load resistance is enlarged to the end of lowering the consumptive current, a MOS transistor is connected in parallel with the load resistance, whereby the high potential of the output can be raised, so that a high potential output required as the ECL circuit can be obtained even when the load resistance is high or the current gain of a bipolar transistor is low.

What is claimed is:

1. A semiconductor circuit wherein a plurality of circuits, each of which includes a current switch and an emitter follower, are connected in parallel through emitter coupling of the emitter followers of the plurality of circuits so as to construct a logical OR function; the semiconductor circuit comprising first switching means for turning "on" and "off" a switching current of said current switch, and a second switching means coupled between a load resistance of said current switch and a base of said emitter follower, both said first and second switching means being constructed of MOS transistors, the respective switching means being turned "on" and "off" by applying control signals to gates of said MOS transistors, and both said first and second switching means being turned "off" in each of the current switches of nonselected ones of said plurality of circuits, thereby to lower an output potential of said emitter follower.

2. The semiconductor circuit as defined in claim 1, wherein said current switch has a MOS transistor connected in parallel with a load resistance thereof, and an "on" resistance of said MOS transistor is changed in accordance with input signals of said current switch so that, when the output is a high potential, the "on" resistance may be lowered, and that, when the output is a low potential, either the "on" resistance may be raised or said MOS transistor may be turned "off."

3. The semiconductor circuit as defined in claim 2, wherein a control circuit of said MOS transistor connected in parallel with said load resistance employs a current mirror circuit which is configured of MOS transistors.

4. The semiconductor circuit as defined in claim 2, wherein said current switch has the MOS transistor connected in parallel with the load resistance on at least one of a true side, and a complementary side of said true side, and the "on" resistance of said MOS transistor on said at least one side is controlled by a complementary output of said current switch in accordance with the input signals of said current switch.

5. A semiconductor memory having pairs of data lines wherein each pair of data lines, to which a plurality of memory cells are connected, is provided with a reading differential amplifier which is configured of MOS transistors and which receives signals of the data lines as input gate signals, and drains of the MOS differential amplifiers in a plurality of columns are connected to form a pair of common readout data lines; the semiconductor memory comprising an arrangement in which said pair of common readout data lines are respectively connected to emitters of bipolar transistors, bases thereof are supplied with a constant voltage, and load resistances are connected between collectors thereof and a plus side supply voltage, wherein values of bias currents which are caused to flow to said pair of common readout data lines separately from currents from said reading differential amplifier are changed in correspondence with operating timings of said memory.

6. The semiconductor memory as defined in claim 5, wherein the values of the bias currents which are caused to flow to said pair of common readout data lines are greater in a period between a point of time at which said memory shifts from a standby mode to an operating mode and another point of time at which said reading differential amplifier is selected to start causing the signal currents to flow, than in a period of another standby mode or a period of "on" of said reading differential amplifier.

7. A semiconductor circuit comprising:
a first circuit having a bipolar current switch and a bipolar emitter-follower;
a second circuit for controlling a current through the first circuit, connected to at least one of a common emitter node of said bipolar current switch and an output of the emitter-follower, said second circuit having at least one MOS transistor arranged to cause the current in said first circuit to be smaller in a standby mode than the current in said first circuit in an operating mode thereof, a first current source for a minute current which is normally caused to flow, and a second current source for a larger current which can be switched on and off;
a third circuit for use as a load circuit of said bipolar current switch connected to a collector of said bipolar current switch, said third circuit having at lease one MOS transistor arranged to render an output voltage level of said first circuit to substantially the same high and low level values irrespective of values of the current;
wherein in accordance with a control timing arrangement the current of said first circuit is caused to flow by both the first and second current sources in the operating mode and the current is caused to flow by only the second current course in the standby mode.

8. The semiconductor circuit of claim 7, wherein at least one MOS transistor for changing over an operating current of the second circuit and at least one MOS transistor for changing over an effective load resistance of the third circuit, operate in interlocking fashion so as to use a low load resistance for the large operating current and a high load resistance for the minute operating current.

9. The semiconductor circuit of claim 8, wherein a product between the low load resistance and the large operating current is substantially equal to a product between the high load resistance and the minute operating current.

10. A semiconductor circuit comprising:
a first circuit having a bipolar current switch and a bipolar emitter-follower;
a second circuit, for controlling a current through the first circuit, connected to at least one of a common emitter node of said bipolar current switch and an output of the emitter-follower, said second circuit having at least one MOS transistor for causing the current in said first circuit to be smaller in a standby mode than the current in said first circuit in an operating mode thereof; and, a third circuit for use as a load circuit of said bipolar current switch, connected to a collector of said bipolar current switch, said third circuit having two P-channel MOS transistors, each source of which is commonly connected and each gate of which is connected to a drain of the other MOS transistor, and a plurality of diodes coupled in parallel with the respective P-channel MOS transistors each of which has its anode connected to the source of the corresonding MOS transistor and its cathode connected to the drain thereof, wherein said third circuit renders high and low output voltage levels of said first circuit to substantially the same values irrespective of values of said current.

11. The semiconductor circuit of claim 10, wherein an absolute value of a threshold voltage of said each P-channel MOS transistor in said third circuit is set to be smaller than that of a forward voltage of said each diode in said third circuit.

12. A semiconductor circuit comprising:
a first circuit having a bipolar current switch and a bipolar emitter-follower;
a second circuit for controlling a current through the first circuit, connected to at least one of a common emitter node of said bipolar current switch and an output of the bipolar emitter-follower, and having at least one MOS transistor arranged to cause the current in said first circuit to be smaller in a standby mode than the current in said first circuit in an operating mode thereof; and,
a third circuit connected as a load to a collector of said bipolar current switch such that high and low output voltage levels of said first circuit are substantially constant irrespective of a variance in value of said current, wherein said second and third circuits comprise MOS transistors having channel conductivity types different from each other and the MOS transistors are turned "on" and "off" by applying signals having different polarities from each other.

13. A semiconductor circuit comprising:
a first circuit having a bipolar current switch and a bipolar emitter-follower;
a second circuit connected to at least one of a common emitter node of said bipolar current switch and an output of the bipolar emitter-follower for control of a current through the first circuit such that the current in said first circuit is made smaller in a standby mode than the current in said first circuit in an operating mode thereof, the second circuit having two sets of MOS transistors connected in series, wherein pulse control signals having polarities different from each other are applied to gates of two MOS transistors selected from the series of MOS transistors, and wherein a common bias voltage is applied to gates of two other MOS transistors, such that a current of said second circuit changes over between two current values determined by a ratio of gate width to gate length of the MOS transistors to which the bias voltage is applied; and,
a third circuit connected as a load to a collector of said bipolar current switch, having at least one MOS transistor arranged such that high and low output voltage levels of said first circuit are substantially constant irrespective of a variance in value of said current.

14. A semiconductor circuit comprising:
a first circuit having a bipolar current switch and a bipolar emitter-follower;
a second circuit arranged to control a current through the first circuit, connected to at least one of a common emitter node of said bipolar current switch and an output of the emitter-follower; and,
a third circuit acting as a load circuit of said bipolar current switch, connected to a collector of said bipolar current switch, wherein said second circuit causes the current in said first circuit to be smaller in a standby mode than the current in said first circuit in an operating mode thereof, said third circuit having at least one MOS transistor arranged to render high and low output voltage levels of said first circuit substantially the same irrespective of values of said current, wherein said second circuit is constructed of two sets, each set made up of a bipolar transistor, a resistance and a MOS transistor, and wherein the current of said second circuit is changed in such a manner that the two MOS transistors are turned on and off to control base voltages of the bipolar transistors.

15. A semiconductor circuit comprising:
a first circuit having a bipolar current switch and a bipolar emitter-follower;
a second circuit connected to at lesat one of a common emitter node of said bipolar current switch and an output of the emitter-follower, for controlling the current through the first circuit, the second circuit including at least one MOS transistor for causing the current in said first circuit to be smaller in a standby mode than the current in said first circuit in an operating mode; and,
a third circuit connected to a collector of said bipolar current switch, said third circuit including a parallel circuit between a series circuit of a first switching MOS transistor and a low resistance and another series circuit of a second switching MOS transistor and a high resistance, wherein each of a low resistance circuit and a high resistance circuit is effectively realized by turning on only one of said first and second MOS transistors.

* * * * *

UNITED STATES PATENT AND TRADEMARK OFFICE
CERTIFICATE OF CORRECTION

PATENT NO. : 4,999,519

DATED : March 12, 1991

INVENTOR(S) : Goro Kitsukawa, et al.

It is certified that error appears in the above-identified patent and that said Letters Patent is hereby corrected as shown below:

Claim 7, column 24, line 40, delete "lease" and insert therefor --least--.

Signed and Sealed this

Twenty-ninth Day of September, 1992

Attest:

DOUGLAS B. COMER

*Attesting Officer*   *Acting Commissioner of Patents and Trademarks*